US012289962B2

(12) United States Patent
Jo et al.

(10) Patent No.: US 12,289,962 B2
(45) Date of Patent: Apr. 29, 2025

(54) DISPLAY PANEL AND ELECTRONIC APPARATUS

(71) Applicant: Samsung Display Co., Ltd., Yongin-si (KR)

(72) Inventors: Junyoung Jo, Yongin-si (KR); Haeyeon Lee, Yongin-si (KR); Yunkyeong In, Yongin-si (KR); Hyunji Cha, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 512 days.

(21) Appl. No.: 17/836,633

(22) Filed: Jun. 9, 2022

(65) Prior Publication Data
US 2023/0030352 A1 Feb. 2, 2023

(30) Foreign Application Priority Data

Aug. 2, 2021 (KR) .......................... 10-2021-0101531

(51) Int. Cl.
*H10K 59/122* (2023.01)
*H10K 50/844* (2023.01)
*H10K 102/00* (2023.01)

(52) U.S. Cl.
CPC ......... *H10K 59/122* (2023.02); *H10K 50/844* (2023.02); *H10K 2102/311* (2023.02)

(58) Field of Classification Search
CPC .. H10K 59/122; H10K 59/352; H10K 59/353; H10K 59/00; H10K 59/126; H10K 50/844; H10K 50/8426; H10K 50/865; H10K 2102/311; H10K 77/111
See application file for complete search history.

(56) References Cited

U.S. PATENT DOCUMENTS

| | | | | |
|---|---|---|---|---|
| 2020/0365664 | A1* | 11/2020 | Jeon | H10K 71/421 |
| 2021/0066648 | A1* | 3/2021 | Chung | H10K 50/865 |
| 2021/0343811 | A1* | 11/2021 | Kim | H10K 59/124 |
| 2021/0359047 | A1* | 11/2021 | Yoon | H10K 59/122 |
| 2021/0376007 | A1* | 12/2021 | Choi | H10K 50/844 |

(Continued)

FOREIGN PATENT DOCUMENTS

| | | |
|---|---|---|
| CN | 110678983 | 1/2020 |
| CN | 110767702 | 2/2020 |

(Continued)

*Primary Examiner* — Shaun M Campbell
(74) *Attorney, Agent, or Firm* — KILE PARK REED & HOUTTEMAN PLLC

(57) ABSTRACT

An electronic apparatus comprises a display panel and a component on a lower surface of the display panel. The display panel includes a first display area with first light-emitting diodes, a second display area with display element groups that include second light-emitting diodes, transmission areas in the second display area, a pixel-defining layer surrounding an emission area of each of the first and second light-emitting diodes, an upper insulating layer, and a thin-film encapsulation layer. The component overlaps the second display area in a plan view. In a boundary portion of the first and second display areas, the pixel-defining layer and the upper insulating layer form a staircase-shaped step, and the upper insulating layer includes at least one protrusion portion protruding towards the second display area from an edge of the upper insulating layer.

20 Claims, 21 Drawing Sheets

(56) References Cited

U.S. PATENT DOCUMENTS

| | | | | |
|---|---|---|---|---|
| 2022/0077430 A1* | 3/2022 | Choi | ................... | H10K 59/8792 |
| 2022/0140023 A1* | 5/2022 | Jeon | .................... | H10K 59/122 |
| | | | | 257/40 |
| 2022/0149135 A1* | 5/2022 | Choi | ....................... | H10K 59/38 |
| 2022/0199946 A1* | 6/2022 | Lee | ........................ | H01L 27/124 |
| 2023/0320178 A1* | 10/2023 | Park | .................. | H10K 59/1201 |
| | | | | 257/40 |

FOREIGN PATENT DOCUMENTS

| | | |
|---|---|---|
| CN | 112271207 | 1/2021 |
| KR | 10-2020-0131400 | 11/2020 |

\* cited by examiner

DISPLAY PANEL AND ELECTRONIC APPARATUS

CROSS-REFERENCE TO RELATED APPLICATION(S)

This application claims priority to and benefits of Korean Patent Application No. 10-2021-0101531 under 35 U.S.C. § 119, filed on Aug. 2, 2021, in the Korean Intellectual Property Office, the entire contents of which are incorporated herein by reference.

BACKGROUND

1. Technical Field

The embodiments relate to a display panel and an electronic apparatus including the display panel.

2. Description of the Related Art

Recently, the usage of display panels has diversified. As display panels have become thinner and more lightweight, their range of use has gradually expanded.

As the area occupied by a display area in display panels has expanded, various functions that are combined with or linked to the display panels have been added. In order to add various functions while increasing the display area, research has been conducted into a display panel having an area for adding other functions than an image display in a display area.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Components such as a camera or a sensor may be arranged in a display panel to add various functions. Such components may overlap a display area to increase the size of the display area. A display panel may include a transmission area through which a wavelength such as light or sound may pass to accommodate such components. The disclosure includes a display panel having the above structure and an electronic device including the display panel.

Additional aspects will be set forth in part in the description which follows and, in part, will be apparent from the description, or may be learned by practice of the embodiments of the disclosure.

According to an embodiment, an electronic apparatus may include a display panel including a first display area, first light-emitting diodes disposed in the first display area, a second display area, display element groups comprising second light-emitting diodes, the display element groups disposed in the second display area, transmission areas disposed in the second display area, a pixel-defining layer disposed on a substrate and surrounding an emission area of each of the first light-emitting diodes and each of the second light-emitting diodes, an upper insulating layer disposed above the pixel-defining layer, and a thin-film encapsulation layer overlapping the first light-emitting diodes and the second light-emitting diodes in a plan view, the thin-film encapsulating layer including an inorganic encapsulation layer and an organic encapsulation layer, and a component disposed on a lower surface of the display panel and overlapping the second display area in a plan view. The pixel-defining layer and the upper insulating layer may form a staircase-shaped step in a boundary portion of the first display area and the second display area. The upper insulating layer may include at least one protrusion disposed in the boundary portion of the first display area and the second display area, the at least one protrusion portion protruding in a direction towards the second display area from an edge of the upper insulating layer.

The pixel-defining layer may include first openings corresponding to the first light-emitting diodes, second openings corresponding to the second light-emitting diodes, and third openings corresponding to the transmission areas.

The at least one protrusion portion may include a plurality of protrusion portions disposed between display element groups that are disposed at an outermost portion of the second display area in a plan view.

The at least one protrusion portion may include a plurality of protrusion portions, and the plurality of protrusion portions may be spaced apart by a distance from each other along the boundary portion of the first display area and the second display area in a plan view.

The at least one protrusion portion may have a polygonal shape in a plan view.

The electronic apparatus may further include an inorganic insulating layer disposed between the substrate and the second light-emitting diodes, a first organic insulating layer disposed between the inorganic insulating layer and the second light-emitting diodes, and a second organic insulating layer disposed between the first organic insulating layer and the second light-emitting diodes. The inorganic insulating layer may include openings corresponding to the transmission areas, and the first organic insulating layer fills in the openings of the inorganic insulating layer.

The pixel-defining layer may include a light-shielding material.

The electronic apparatus may further include a blocking metal layer disposed between the substrate and the second light-emitting diodes in the second display area. The blocking metal layer may include openings corresponding to the transmission areas.

Edges of the openings of the blocking metal layer may include fine protrusions.

The electronic apparatus may further include a spacer protruding in a vertical direction from an upper surface of the upper insulating layer, wherein the spacer and the upper insulating layer include a same material.

According to an embodiment, a display panel may include a first display area, first light-emitting diodes disposed in the first display area, a second display area, display element groups comprising second light-emitting diodes, the display element groups disposed in the second display area, transmission areas disposed in the second display area, a pixel-defining layer arranged on a substrate and surrounding an emission area of each of the first light-emitting diodes and each of the second light-emitting diodes, an upper insulating layer disposed above the pixel-defining layer, and a thin-film encapsulation layer overlapping the first light-emitting diodes and the second light-emitting diodes in a plan view, the thin-film encapsulation layer including an inorganic encapsulation layer and an organic encapsulation layer. The pixel-defining layer and the upper insulating layer may form a staircase-shaped step in a boundary portion of the first display area and the second display area. The upper insulating layer may include at least one protrusion disposed in the boundary portion of the first display area and the second display area, the at least one protrusion portion protruding in a direction towards the second display area from an edge of the upper insulating layer.

The pixel-defining layer may include first openings corresponding to the first light-emitting diodes, second openings corresponding to the second light-emitting diodes, and third openings corresponding to the transmission areas.

The at least one protrusion portion may include a plurality of protrusion portions disposed between display element groups that are disposed at an outermost portion of the second display area in a plan view.

The at least one protrusion portion may include a plurality of protrusion portions, and the plurality of protrusion portions may be spaced apart by a distance from each other along the boundary portion of the first display area and the second display area in a plan view.

The at least one protrusion portion may have a polygonal shape in a plan view.

The electronic apparatus may further include an inorganic insulating layer disposed between the substrate and the second light-emitting diodes, a first organic insulating layer disposed between the inorganic insulating layer and the second light-emitting diodes, and a second organic insulating layer disposed between the first organic insulating layer and the second light-emitting diodes. The inorganic insulating layer may include openings corresponding to the transmission areas. The first organic insulating layer may fill in the openings of the inorganic insulating layer.

The pixel-defining layer may include a light-shielding material.

The electronic apparatus may further include a blocking metal layer disposed between the substrate and the second light-emitting diodes in the second display area. The blocking metal layer may include openings corresponding to the transmission area.

Edges of the openings of the blocking metal layer may include fine protrusions.

The electronic apparatus may further include a spacer protruding in a vertical direction from an upper surface of the upper insulating layer. The spacer and the upper insulating layer may include a same material.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION OF THE EMBODIMENTS

Figure 1:
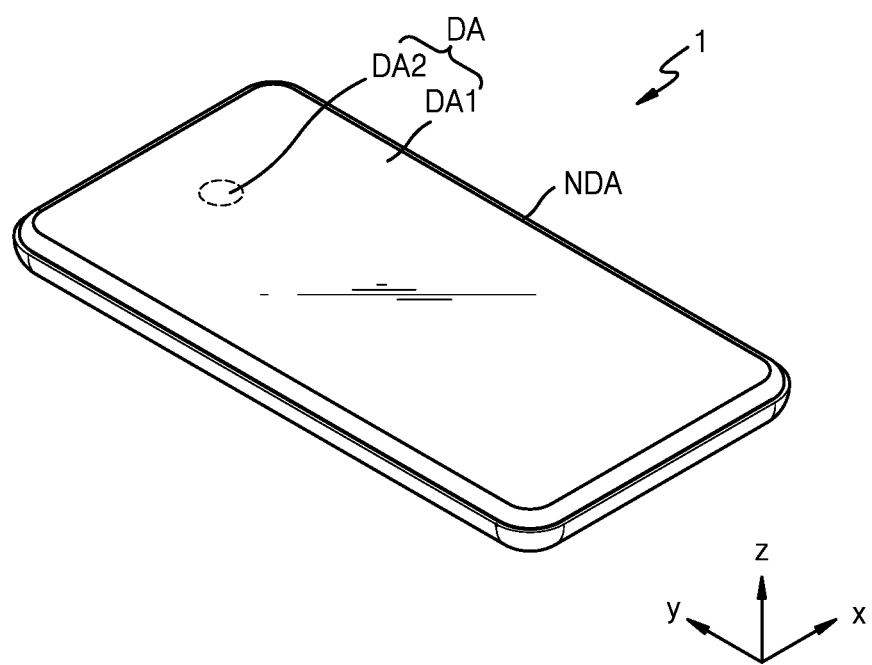
FIG. 1 is a schematic perspective view illustrating an electronic apparatus according to an embodiment.

Reference will now be made in detail to embodiments, examples of which are illustrated in the accompanying drawings, wherein like reference numerals refer to like elements throughout the disclosure. In this regard, the embodiments of the disclosure may have different forms and should not be construed as being limited to the descriptions set forth herein. Accordingly, the embodiments are merely described below, by referring to the figures, to explain aspects of the description of the disclosure. As used herein, the term "and/or" includes any and all combinations of one or more of the associated listed items. Throughout the disclosure, the expression "at least one of a, b and c" indicates only a, only b, only c, both a and b, both a and c, both b and c, all of a, b, and c, or any variations thereof.

The disclosure may, however, be embodied in many different forms and should not be construed as being limited to the embodiments set forth herein. Advantages and features of the disclosure and methods of accomplishing the same may be understood more readily by reference to the following detailed description of embodiments and the accompanying drawings. However, the embodiments of the disclosure may be implemented in various forms and are not limited to the embodiments presented below.

Hereinafter, embodiments will be described with reference to the accompanying drawings, wherein like reference numerals refer to like elements throughout the disclosure and a repeated description thereof is omitted.

In an embodiment below, terms such as "first" and "second" are used herein merely to describe a variety of elements, but the elements are not limited by the terms. Such terms are used only for the purpose of distinguishing one element from another element.

In an embodiment below, an expression used in the singular encompasses the expression of the plural, unless it has a clearly different meaning in the context.

It will be understood that the terms "comprise," "comprising," "include" and/or "including" as used herein specify the presence of stated features or components but do not preclude the addition of one or more other features or components.

In an embodiment below, it will be understood that when a component, such as a layer, a film, a region, or an element, is referred to as being "on" another portion, the element can be directly on the other element or intervening components may be present thereon.

In the disclosure, the term "and/or" includes any and all combinations of one or more of the associated listed items. For example, "A and/or B" may include "A," "B," or "A and B."

In the drawings, sizes, thicknesses, ratios, and dimensions of the elements may be exaggerated for ease of description and for clarity. Like numbers refer to like elements throughout.

When an embodiment may be implemented differently, a process order may be performed differently from the described order. For example, two consecutively described processes may be performed substantially at the same time or performed in an order opposite to the described order.

It will be understood that when a layer, region, or element is referred to as being "connected" to another layer, region, or element, it may be "directly connected" to the other layer, region, or element or may be "indirectly connected" to the other layer, region, or element with other layer, region, or element therebetween. For example, it will be understood that when a layer, region, or element is referred to as being "electrically connected" to another layer, region, or element, it may be "directly electrically connected" to the other layer, region, or element or may be "indirectly electrically connected" to other layer, region, or element with other layer, region, or element therebetween.

"About," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

FIG. 1 is a schematic perspective view illustrating an electronic apparatus 1 according to an embodiment.

The electronic apparatus 1 includes an apparatus for displaying moving images or still images and may be used as a display screen of various products such as televisions, laptop computers, monitors, advertisement boards, and Internet of Things (IoT) as well as portable electronic devices such as mobile phones, smartphones, tablet personal computers (PCs), mobile communication terminals, electronic notebooks, electronic books, portable multimedia players (PMPs), navigations, and ultra-mobile PCs (UMPCs). The electronic apparatus 1 according to an embodiment may be used in wearable devices such as smart watches, watch phones, glasses-type displays, and head-mounted displays (HMDs). The electronic apparatus 1 may be used as instrument panels for automobiles, center dashboards for automobiles, or center information displays (CID) arranged on a dashboard, room mirror displays that replace side-view mirrors of automobiles, and displays arranged on the backside of front seats as entertainment for back seats of automobiles. FIG. 1 illustrates that the electronic apparatus 1 is used as a smartphone, for convenience of explanation.

Referring to FIG. 1, the electronic apparatus 1 may include a display area DA and a non-display area NDA that is disposed outside of the display area DA. The electronic apparatus 1 may provide an image through an array of pixels arranged in a two-dimensional manner in the display area DA.

The non-display area NDA includes an area in which images are not provided, and may entirely surround the display area DA. A driver, etc. for providing electrical signals or power to display elements arranged in the display area DA may be arranged in the non-display area NDA. A pad, which is an area to which an electronic device, a printed circuit board, etc. may be electrically connected, may be arranged in the non-display area NDA.

The display area DA may include a first display area DA1 and a second display area DA2. The second display area DA2 may include an area in which a component for adding various functions to the electronic apparatus 1 is arranged, and may correspond to a component area.

Figure 2A:
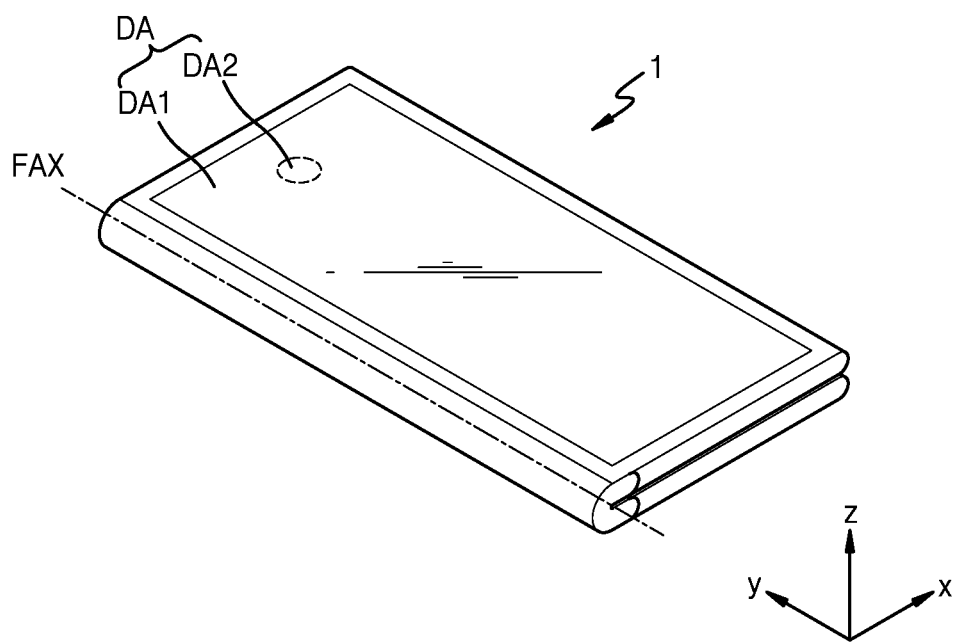
FIG. 2A is a schematic perspective view illustrating the foldable electronic apparatus in a folded state according to an embodiment.
Figure 2B:
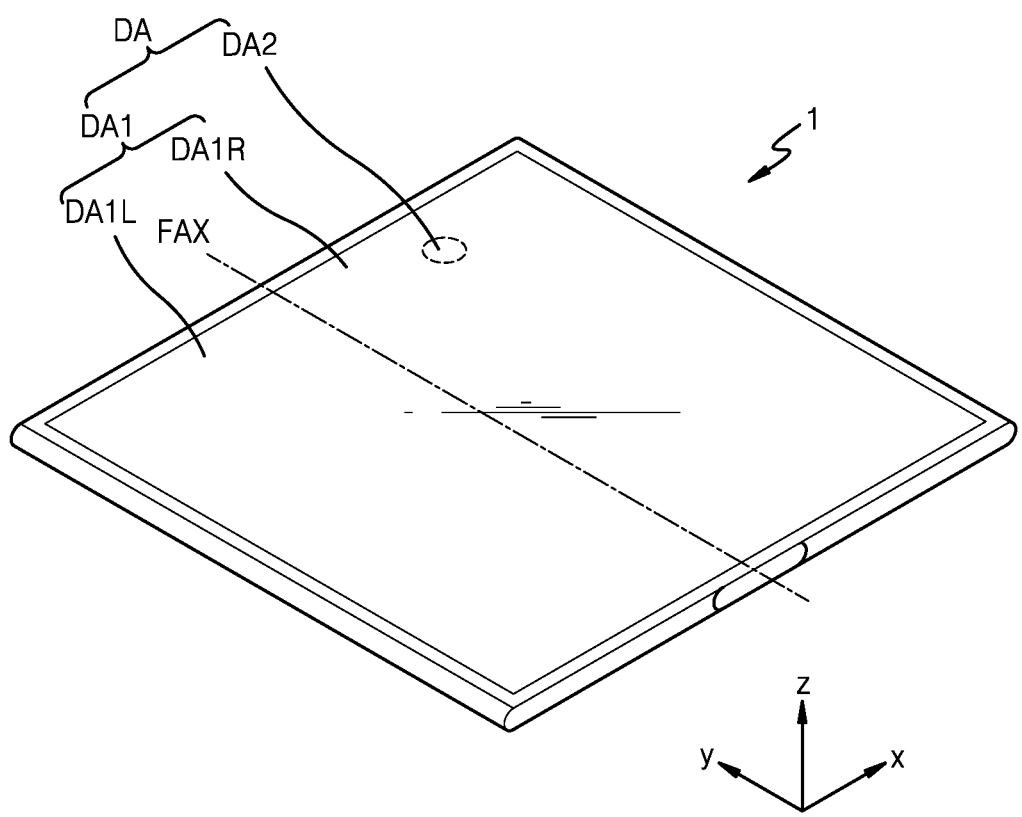
FIG. 2B schematically illustrates the foldable electronic apparatus in an unfolded state according to an embodiment.

FIGS. 2A and 2B are schematic perspective views of a foldable electronic apparatus according to an embodiment. FIG. 2A illustrates the foldable electronic apparatus in a folded state, and FIG. 2B illustrates the foldable electronic apparatus in an unfolded state.

The electronic apparatus 1 according to an embodiment may include a foldable electronic apparatus. The electronic apparatus 1 may be folded with respect to a folding axis FAX. The display area DA may be located on the outside and/or inside of the electronic apparatus 1. In an embodiment, FIG. 2A shows that the display area DA is located outside of the electronic apparatus 1. In an embodiment, FIG. 2B shows that the display area DA is located inside of the electronic apparatus 1.

Referring to FIG. 2A, the display area DA may be arranged on the outside of the electronic apparatus 1. An outer surface of the electronic apparatus 1 that is folded may include the display area DA, which may include the first display area DA1 that occupies a majority of the display area DA, and the second display area DA2 having a relatively smaller area than the first display area DA1.

Referring to FIG. 2B, the display area DA may be arranged on the inside of the electronic apparatus 1. An inner surface of the electronic apparatus 1 that is unfolded may include the display area DA, which may include the first display area DA1 that occupies a majority of the display area DA, and the second display area DA2 having a relatively smaller area than the first display area DA1.

FIG. 2B shows that the first display area DA includes a left display area DA1L and a right display area DA1R that are arranged at opposite sides with respect to a folding axis FAX, wherein the second display area DA2 is located in the right display area DA1R. However, the disclosure is not limited thereto. In other examples, the second display area DA2 may be arranged in the left display area DA1L.

FIGS. 1, 2A, and 2B show that the second display area DA2 is entirely surrounded by the first display area DA, but the disclosure is not limited thereto.

Figure 3:
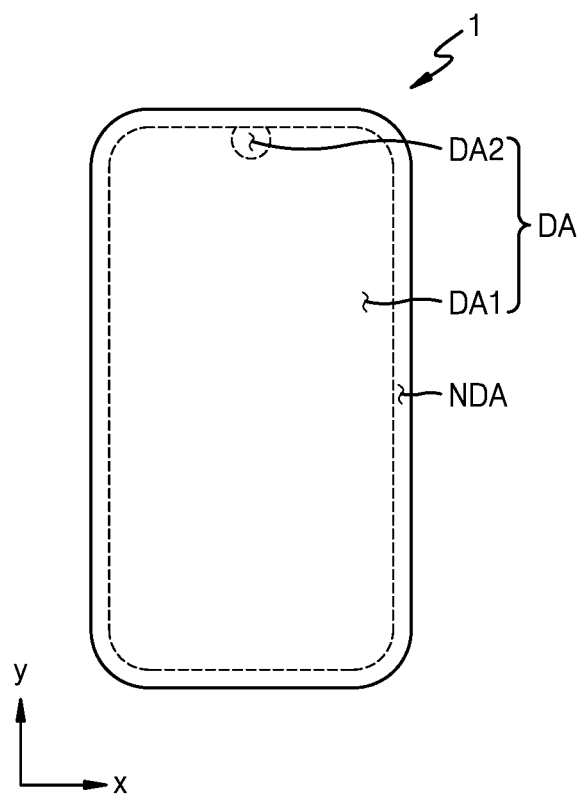
FIG. 3 is a schematic plan view illustrating an electronic apparatus according to an embodiment.

FIG. 3 is a schematic plan view schematically illustrating an electronic apparatus 1 according to an embodiment, wherein the second display area DA2 may be partially surrounded by the first display area DA1 as shown in FIG. 3.

Figure 4:
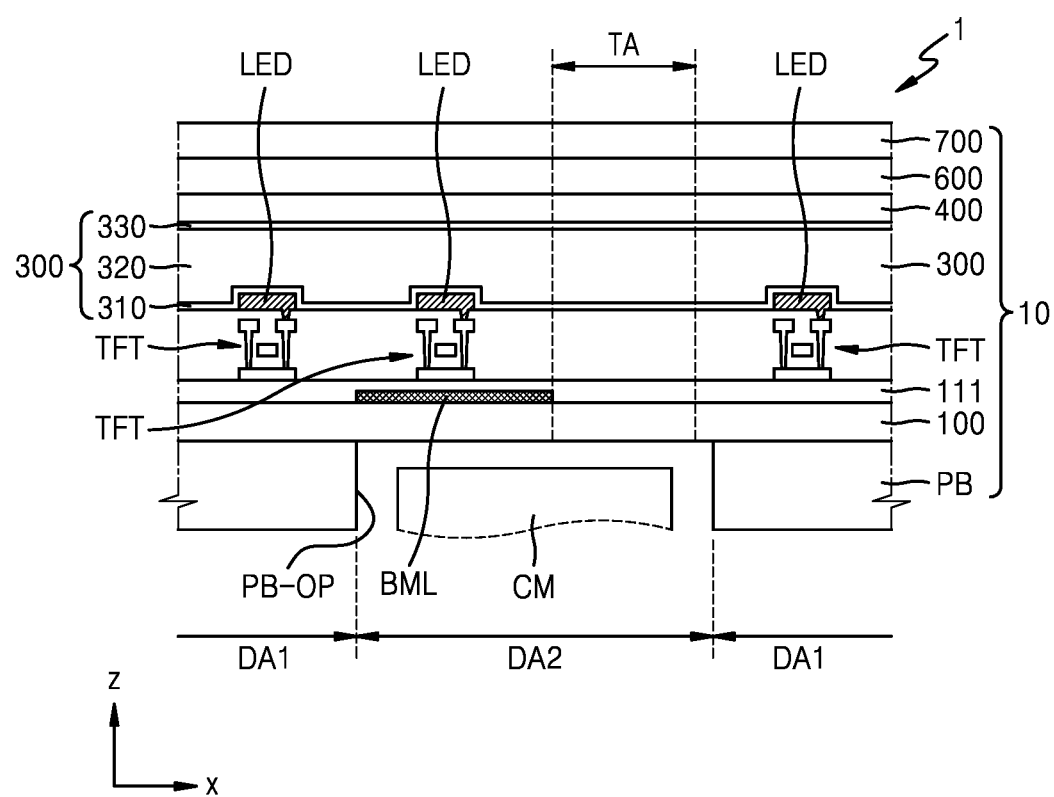
FIG. 4 is a schematic cross-sectional view illustrating a portion of an electronic apparatus according to an embodiment.

FIG. 4 is a schematic cross-sectional view illustrating a portion of an electronic apparatus 1 according to an embodiment.

Referring to FIG. 4, the electronic apparatus 1 may include a display panel 10 and a component CM, the component CM overlapping the display panel on a lower surface of the display panel. The component CM may be located in the second display area DA2.

The display panel 10 may include a substrate 100, a thin-film transistor TFT arranged on the substrate 100, a display element (for example, a light-emitting diode LED) electrically connected to the thin-film transistor TFT, a thin-film encapsulation layer 300 covering the display element, an input sensing layer 400, an optical functional layer 600, and a window 700.

The substrate 100 may include glass or a polymer resin. The substrate 100 including the polymer resin may be flexible, foldable, rollable, or bendable. The substrate 100 may have a multi-layer structure including a layer including the polymer resin described above and an inorganic layer (not shown).

A lower protective film PB may be arranged on a lower surface of the substrate 100. The lower protective film PB may be attached to the lower surface of the substrate 100. For example, an adhesive layer may be between the lower protective film PB and the substrate 100. In some embodiments, the lower protective film PB may be directly provided on a rear surface of the substrate 100, in which case an adhesive layer may not be disposed between the lower protective film PB and the substrate 100.

The lower protective film PB may support and protect the substrate 100. The lower protective film PB may have an opening PB-OP, which corresponds to the second display area DA2. The lower protective film PB may include an organic insulating material such as polyethylene terephthalate (PET) or polyimide (PI).

The thin-film transistor TFT and the light-emitting diode LED, the light-emitting diode LED being a display element electrically connected to the thin-film transistor TFT, may be arranged on an upper surface of the substrate 100. The light-emitting diode LED may include an organic light-emitting diode including an organic material. The organic light-emitting diode may emit red, green, or blue light.

The light-emitting diode LED may include an inorganic light-emitting diode including an inorganic material. The inorganic light-emitting diode may include a p-n junction diode including inorganic semiconductor-based materials. When a voltage is applied to the p-n junction diode in a forward direction, holes and electrons are injected, and energy generated by recombination of the holes and the electrons may be converted into light energy to emit light of a color. The above-described inorganic light-emitting diode may have a width of several to several hundred micrometers or several to several hundred nanometers. In some embodiments, the light-emitting diode LED may include a quantum dot light-emitting diode. An emission layer of the light-emitting diode LED may include an organic material, an inorganic material, quantum dots, an organic material and quantum dots, or an inorganic material and quantum dots.

The light-emitting diode LED may be electrically connected to the thin-film transistor TFT arranged therebelow. Regarding this, FIG. 4 shows that a buffer layer 111 is arranged on the substrate 100, and the thin-film transistor TFT is arranged on the buffer layer 111. The thin-film transistor TFT and the light-emitting diode LED electrically connected to the thin-film transistor TFT may be arranged in the first display area DA1 and the second display area DA2, respectively.

A transmission area TA may be located in the second display area DA2. The transmission area TA may include an area through which light emitted from the component CM and/or proceeding toward the component CM may pass. In the display panel 10, a transmittance of the transmission area TA may be, for example, about 30% or more, about 40% or more, about 50% or more, about 60% or more, about 70% or more, about 75% or more, about 80% or more, about 85% or more, or about 90% or more.

The component CM may include a sensor such as a proximity sensor, an illuminance sensor, an iris sensor, and a face recognition sensor, and a camera (or an image sensor). The component CM may use light. For example, the component CM may emit and/or receive infrared light, ultraviolet light, and visible light. A proximity sensor using infrared light may detect an object arranged adjacent to an upper surface of the electronic apparatus 1, and the illuminance sensor may detect a brightness of light incident to the upper surface of the electronic apparatus 1. An iris sensor may photograph an iris of a person above the electronic apparatus 1, and the camera may receive light from an object arranged on the upper surface of the electronic apparatus 1.

To prevent deterioration of a function of the thin-film transistor TFT arranged in the second display area DA2 due to light passing through the transmission area TA, a blocking metal layer BML may be arranged between the substrate 100 and the buffer layer 111. The blocking metal layer BML may not be located in the first display area DA1. The blocking metal layer BML may be located in the second display area DA2 and may include an opening overlapping the transmission area TA in a plan view.

The thin-film encapsulation layer 300 may cover the light-emitting diodes LED. The thin-film encapsulation layer 300 may include at least one inorganic encapsulation layer and at least one organic encapsulation layer. In an embodiment, the thin film encapsulation layer 300 may include a first inorganic encapsulation layer 310, a second inorganic encapsulation layer 330, and an organic encapsulation layer 320 between the first inorganic encapsulation layer 310 and the second inorganic encapsulation layer 330.

The input sensing layer 400 may be provided on the thin-film encapsulation layer 300. The input sensing layer 400 may obtain coordinate information corresponding to an external input, for example, a touch event of an object such as a finger or a stylus pen. The input sensing layer 400 may include a touch electrode and trace lines electrically connected to the touch electrode. The input sensing layer 400 may sense an external input through a mutual capacitive method or a self-capacitive method.

The optical functional layer 600 may include an anti-reflection layer. The anti-reflection layer may reduce reflectivity of light (external light) incident toward the electronic apparatus 1 from the outside. In an embodiment, the optical functional layer 600 may include a polarizing film. In an embodiment, the optical functional layer 600 may include a filter plate including a black matrix and color filters.

The window 700 may be arranged on the optical functional layer 600. The window may be bonded to the optical functional layer 600 by using an adhesive layer such as an optically clear adhesive. The window 700 may include a glass material and a plastic material. The glass material may include ultra-thin glass. The plastic material may include polyethersulfone, polyacrylate, polyetherimide, polyethylene naphthalate, PET, polyphenylene sulfide, polyarylate, PI, polycarbonate, or cellulose acetate propionate.

Figure 5:
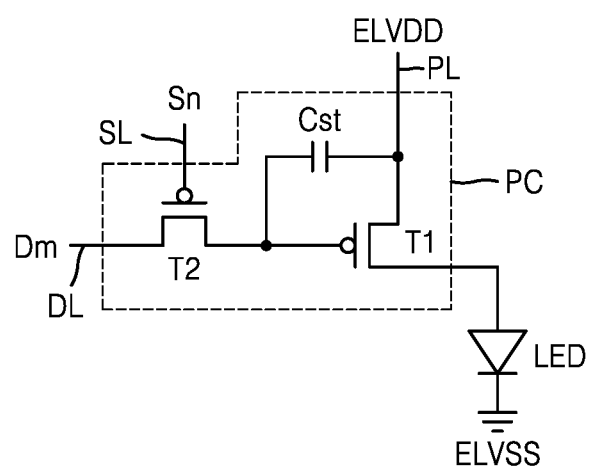
FIG. 5 is an equivalent circuit diagram schematically illustrating a pixel circuit electrically connected to a light-emitting diode of a display panel according to an embodiment.

FIG. 5 is an equivalent circuit diagram schematically illustrating a pixel circuit PC electrically connected to a light-emitting diode LED of a display panel according to an embodiment.

Referring to FIG. 5, the pixel circuit PC may include a first thin-film transistor T1, a second thin-film transistor T2, and a storage capacitor Cst.

The second thin-film transistor T2, which is a switching thin-film transistor, may be electrically connected to a scan line SL and a data line DL and may transfer a data voltage (or data signal) Dm received via the data line DL to the first thin-film transistor T1 based on a switching voltage (or switching signal) Sn received via the scan line SL. The storage capacitor Cst may be electrically connected to the second thin-film transistor T2 and a driving voltage line PL and may store a voltage corresponding to a voltage difference between a voltage received from the second thin-film transistor T2 and a first power voltage ELVDD applied to the driving voltage line PL.

The first thin-film transistor T1, which is a driving thin-film transistor, may be electrically connected to the driving voltage line PL and the storage capacitor Cst and may control a driving current flowing from the driving voltage line PL to a light-emitting element LED) according to the voltage stored in the storage capacitor Cst. The light-emitting diode LED may emit light having a brightness according to the driving current. An opposite electrode (e.g., a cathode) of the light-emitting diode LED may receive a second power supply voltage ELVSS.

Although FIG. 5 illustrates that the pixel circuit PC includes two thin-film transistors and a storage capacitor, the disclosure is not limited thereto. The number of thin-film transistors and the number of storage capacitors may be changed depending on the design of the pixel circuit PC. For example, the pixel circuit PC may include three or more thin-film transistors.

Figure 6A:
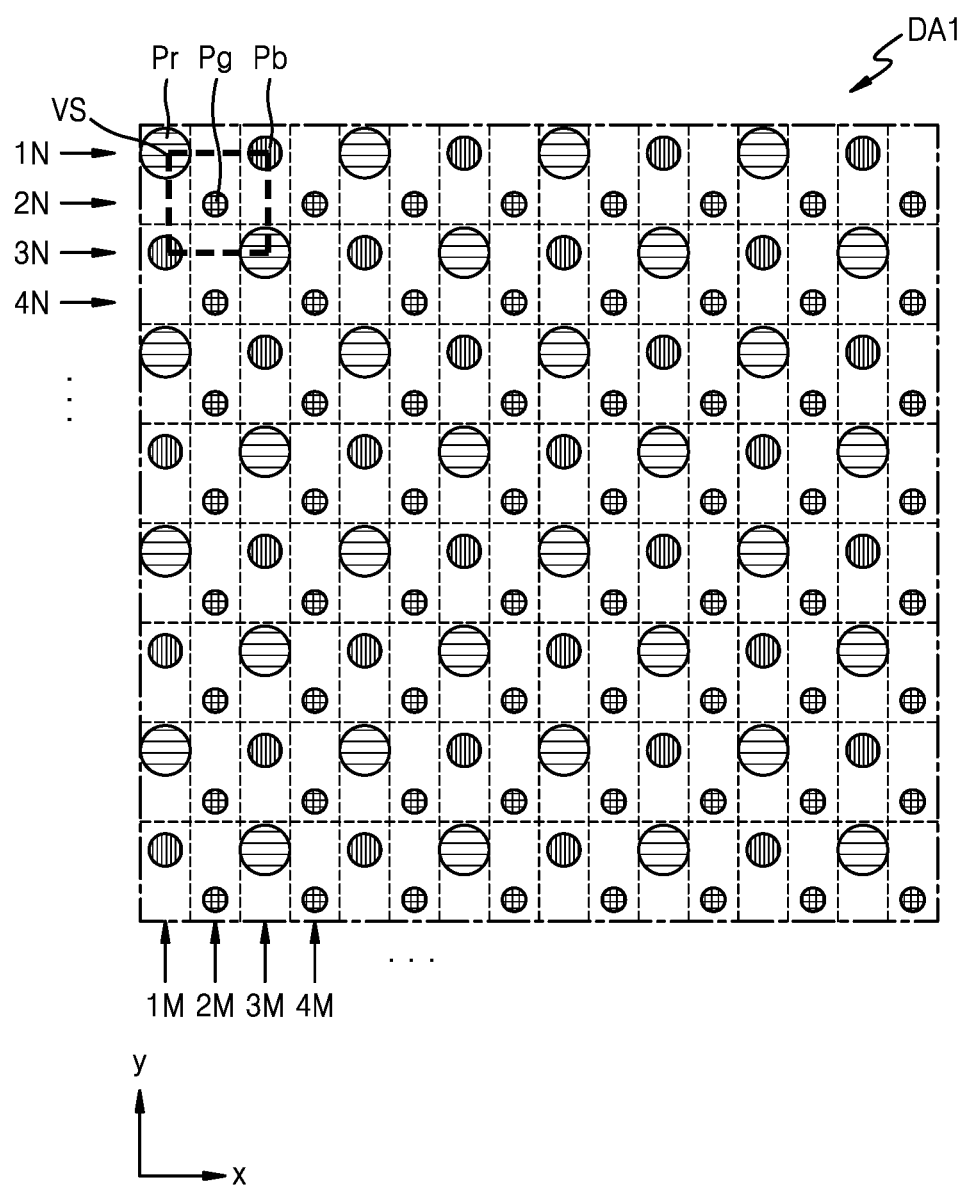
FIGS. 6A and 6B are schematic plan views illustrating a portion of a first display area of a display panel according to embodiments.
Figure 6B:
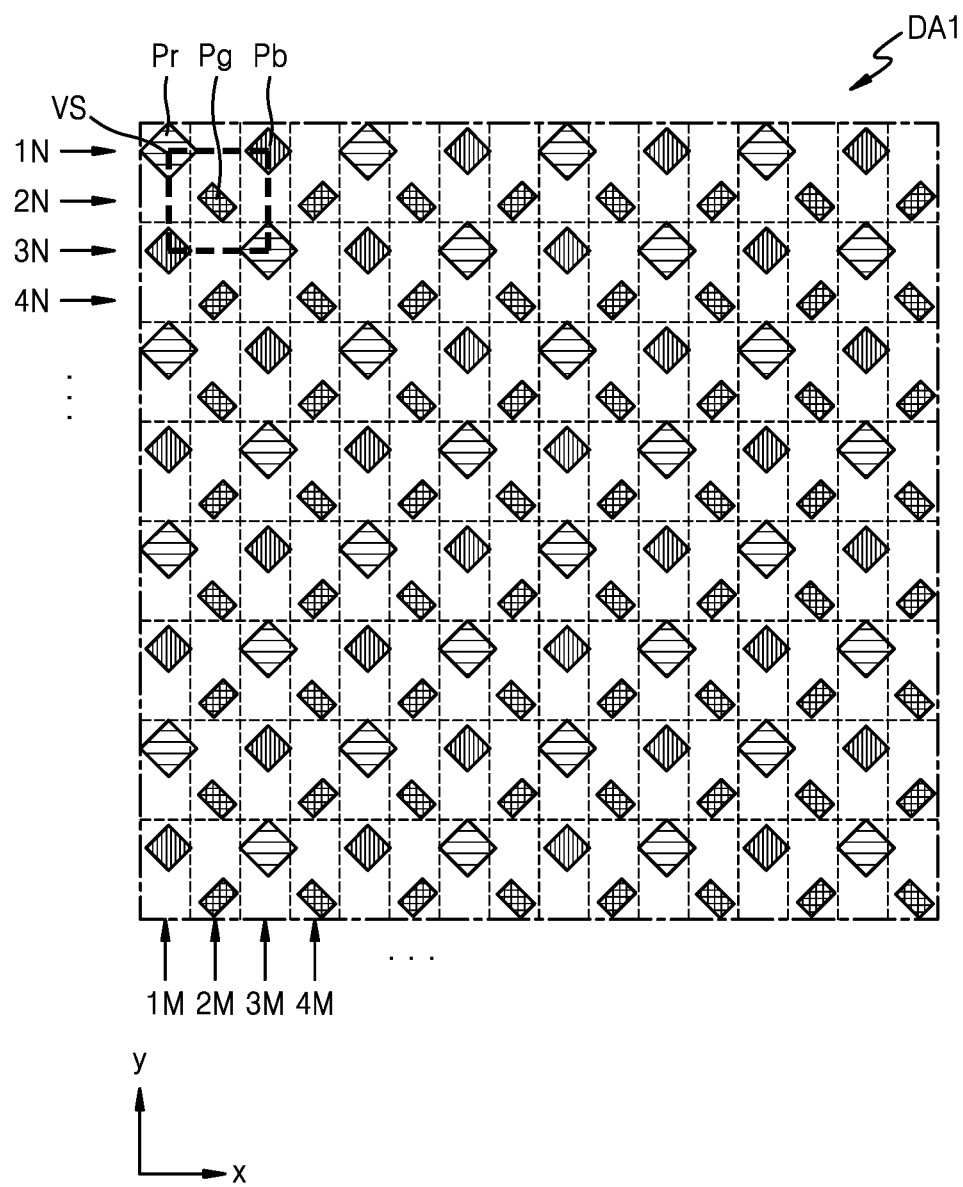

FIGS. 6A and 6B are schematic plan views illustrating a portion of a first display area DA1 of a display panel according to an embodiment.

Referring to FIGS. 6A and 6B, pixels may be arranged in the first display area DA1 and may include first to third pixels emitting light of different colors from each other. Hereinafter, for convenience of explanation, it is described that the first pixel includes a red pixel Pr, the second pixel includes a green pixel Pg, and the third pixel includes a blue pixel Pb.

The red pixel Pr, the green pixel Pg, and the blue pixel Pb may be arranged in the first display area DA1 according to a rule. In some embodiments, the red pixel Pr, the green pixel Pg, and the blue pixel Pb may be arranged in a diamond PENTILE™ type, as shown in FIG. 6B.

For example, red pixels Pr and blue pixels Pb are alternately disposed in a first row 1N, green pixels Pg are spaced apart from each other by a distance in a second row 2N adjacent to the first row 1N, blue pixels Pb and red pixels Pr are alternately disposed in a third row 3N adjacent to the second row 2N, and green pixels Pg are spaced apart from each other by a distance in a fourth row 4N adjacent to the third row 3N, and these pixel arrangements are repeated up to an $N^{th}$ row. The size (or width) of the blue pixels Pb and the red pixels Pr may be greater than the size (or width) of the green pixels Pg.

The red pixels Pr and the blue pixels Pb arranged in the first row 1N and the green pixels Pg arranged in the second row 2N are arranged in a staggered manner. Accordingly, the red pixels Pr and the blue pixels Pb are alternately disposed in a first column 1M, the green pixels Pg are spaced apart from each other by a distance in a second column 2M adjacent to the first column 1M, the blue pixels Pb and the red pixels Pr are alternately disposed in a third column 3M adjacent to the second column 2M, and the green pixels Pg are spaced apart from each other by a distance in a fourth column 4M adjacent to the third column 3M.

The red pixels Pr may be arranged at a first vertex and a third vertex of a virtual quadrilateral VS that face each other. The green pixel Pg is disposed at a center point of the virtual quadrilateral VS. The blue pixels Pb may be arranged at a second vertex and a fourth vertex, the remaining vertices, of the virtual quadrilateral VS. Here, the virtual quadrilateral VS may be modified as, for example, a rectangle, a rhombus, a square, etc.

This pixel arrangement structure may be referred to as a diamond PENTILE™ type. By applying rendering, in which a color of a pixel is represented by sharing the colors of its adjacent pixels, a high resolution may be obtained via a small number of pixels.

The red pixel Pr, the green pixel Pg, and the blue pixel Pb shown in FIGS. 6A and 6B may emit red, green, and blue light by using light-emitting diodes arranged in the corresponding pixels, respectively. Accordingly, an arrangement of the pixels may correspond to an arrangement of the light-emitting diodes, which are display elements. For example, a position of the red pixel Pr shown in FIGS. 6A and 6B may indicate a position of a light-emitting diode emitting red light. Similarly, a position of the green pixel Pg may indicate a position of a light-emitting diode emitting green light, and a position of the blue pixel Pb may indicate a position of the light-emitting diode emitting blue light.

In FIG. 6A, the red pixel Pr, the green pixel Pg, and the blue pixel Pb are each provided in a circular shape, but shapes of the red pixel Pr, the green pixel Pg, and the blue pixel Pb may each be provided in a rectangular shape as shown in FIG. 6B. The red pixel Pr, the green pixel Pg, and the blue pixel Pb may have various shapes, such as ovals, polygons such as hexagons, and polygons with round corners.

Figure 7A:
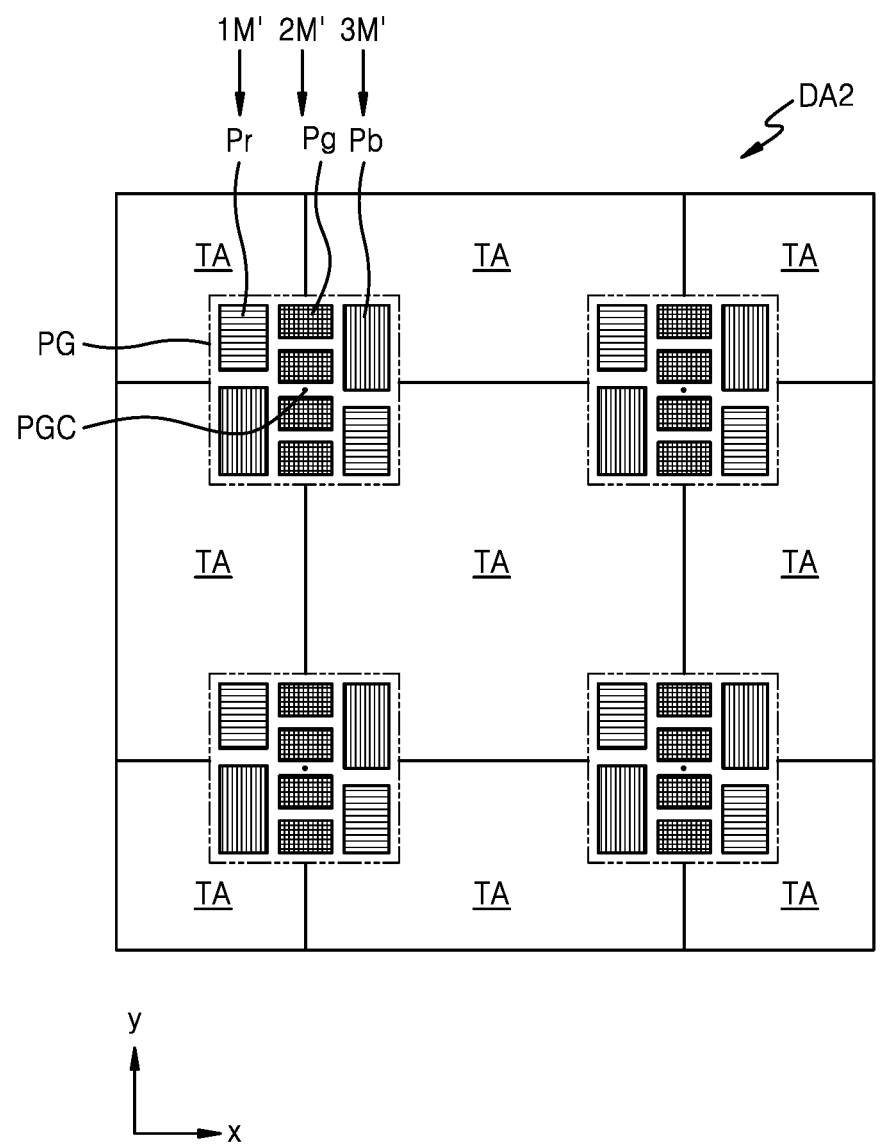
FIGS. 7A and 7B are schematic plan views illustrating a portion of a second display area of a display panel according to embodiments.
Figure 7B:
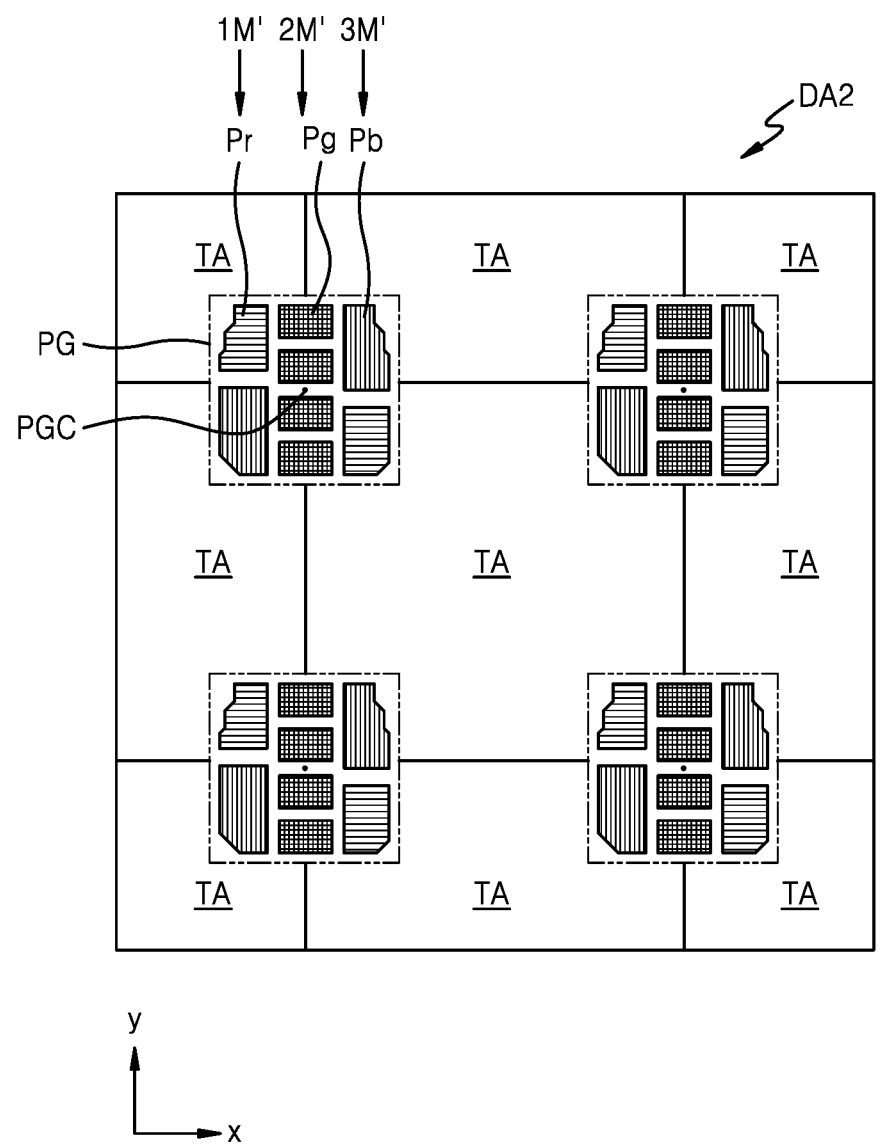

FIGS. 7A and 7B are schematic plan views illustrating a portion of a second display area DA2 of a display panel according to an embodiment.

Referring to FIGS. 7A and 7B, pixel groups PG may be arranged to be apart from each other in the second display area DA2. Each of the pixel groups PG may be surrounded by the transmission area TA, and may include pixels emitting light of different colors, for example, the red pixel Pr, the green pixel Pg, and the blue pixel Pb. In an embodiment, each of the pixel groups PG may include two red pixels Pr, four green pixels Pg, and two blue pixels Pb.

As described above with reference to FIGS. 6A and 6B, the red pixel Pr, the green pixel Pg, and the blue pixel Pb may respectively emit red, green, and blue light using light-emitting diodes disposed in the corresponding pixels, and thus, the arrangement of the pixels may correspond to the arrangement of the light-emitting diodes. Thus, the pixel groups PG described with reference to FIGS. 7A and 7B may correspond to a display element group including a light-emitting diode emitting red light, a light-emitting diode emitting green light, and a light-emitting diode emitting blue light. For example, that the pixel groups PG each including the red pixel Pr, the green pixel Pg, and the blue pixel Pb are spaced apart from each other may indicate that display elements including light-emitting diodes respectively emitting red, green, and blue light are apart from each other.

The pixel groups PG may be symmetrically arranged with respect to a center PGC of the pixel group PG. For example, the red pixel Pr and the blue pixel Pb may be arranged in a first column 1M', and four green pixels Pg may be arranged to be apart from each other in a second column 2M'. The blue pixel Pb and the red pixel Pr may be arranged in a third column 3M'. The red pixel Pr arranged in the first column 1M' may be symmetrical to the red pixel Pr arranged in the third column 3M' with respect to the center PGC of the pixel groups PG. The blue pixel Pb arranged in the first column 1M' and the blue pixel Pb arranged in the third column 3M' may be symmetrical to each other with respect to the center PGC of the pixel group PG. The green pixels Pg arranged in the second column 2M' may be symmetrically arranged with respect to the center PGC of the pixel group PG.

In an embodiment, a length in a y direction of the blue pixel Pb may be greater than a length in the y direction of the red pixel Pr. The length in the y direction of the blue pixel Pb may be greater than or equal to a sum of lengths in the y direction of two green pixels Pg.

Referring to FIG. 7A, each of the red pixel Pr, the green pixel Pg, and the blue pixel Pb may be approximately quadrilateral in a plan view. For example, each of the red pixel Pr and the blue pixel Pb may have a quadrilateral shape having a short side in an x direction and a long side in the y direction. The green pixel Pg may have a quadrilateral shape having a long side in the x direction and a short side in the y direction.

In other examples, at least one of the red pixel Pr, the green pixel Pg, and the blue pixel Pb may include an n-polygon (n is a natural number of 5 or more). For example, as shown in FIG. 7B, the green pixel Pg may be a quadrilateral, but in the red pixel Pr and the blue pixel Pb, an edge adjacent to a transmission area may be bent at least once, and thus, the red pixel Pr and the blue pixel Pb may have the shape of an n-polygon (n is a natural number of 5 or more) in a plan view.

Figure 8:
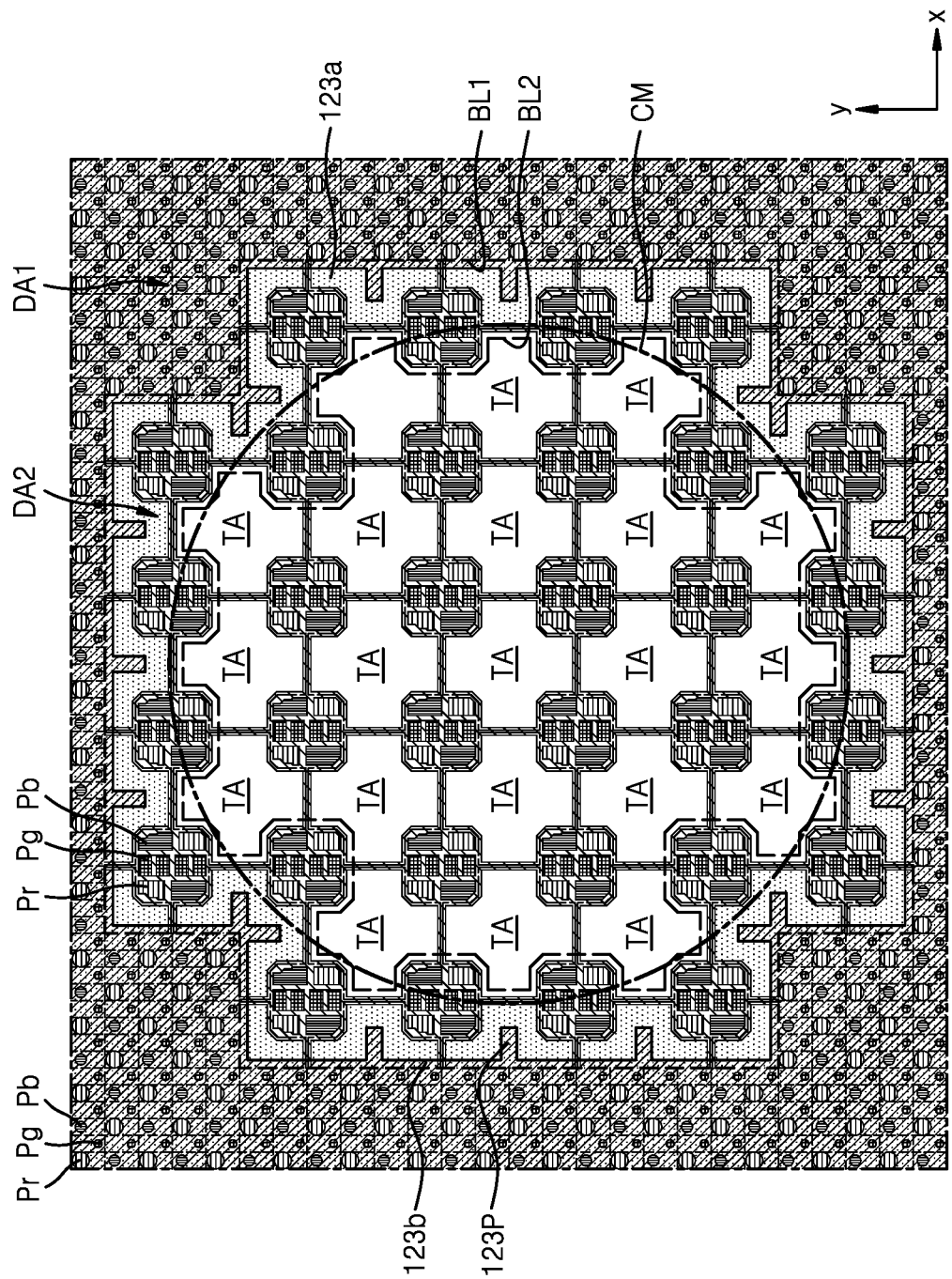
FIG. 8 is a schematic plan view illustrating a second display area of a display panel and a first display area therearound, according to an embodiment.
Figure 9:
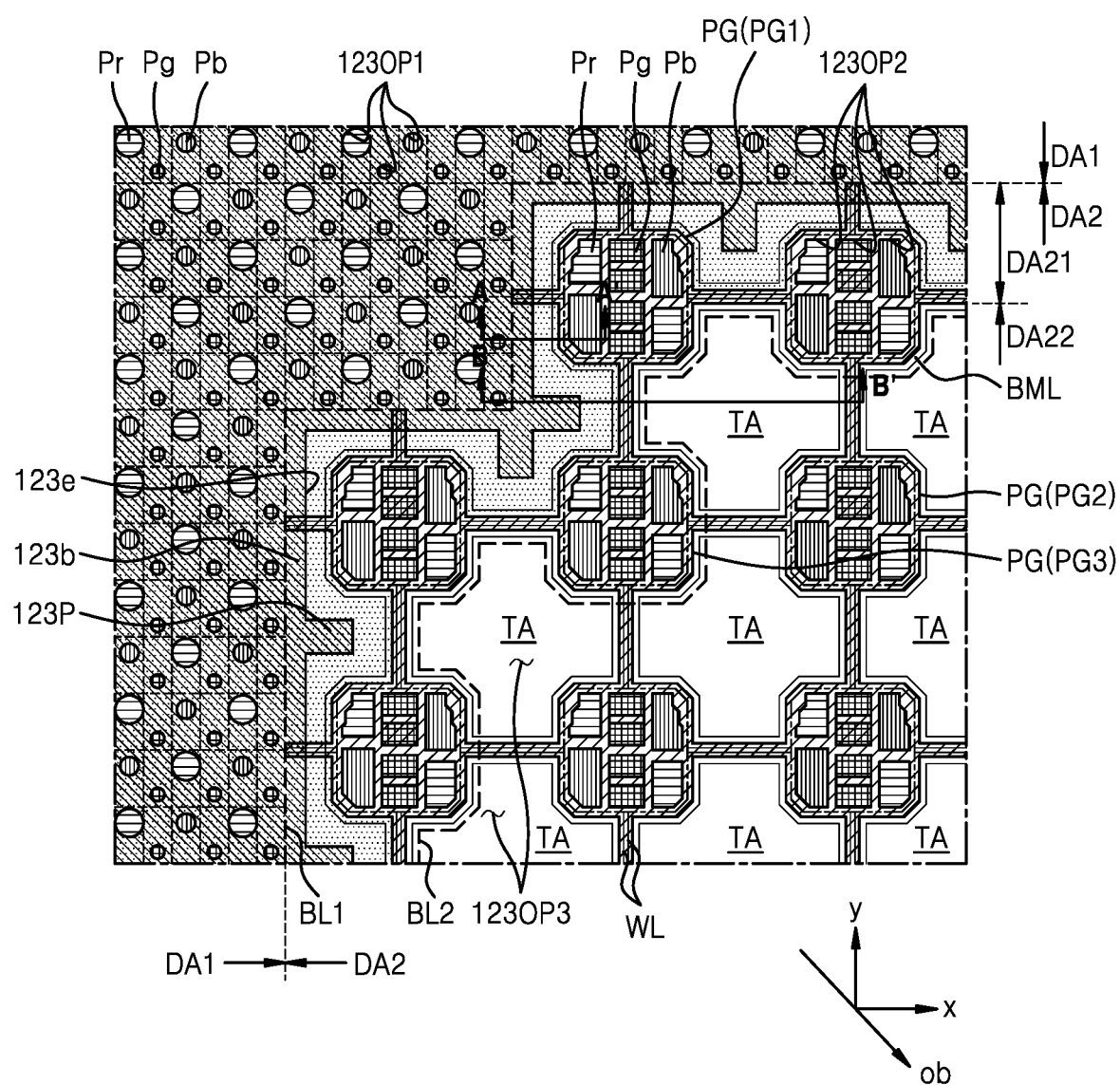
FIG. 9 is a schematic plan view of a portion of the display panel in FIG. 8.

FIG. 8 is a schematic plan view illustrating a second display area DA2 of a display panel and a first display area DA1 around the second display area DA2, according to an embodiment. FIG. 9 is a schematic plan view of the upper left portion of the second display area DA2 in display panel in FIG. 8.

Referring to FIGS. 8 and 9, red, green, and blue pixels Pr, Pg, and Pb may be arranged in the first display area DA1 and the second display area DA2. An arrangement of the red, green, and blue pixels Pr, Pg, and Pb in the first display area DA1 may be the same as or different from an arrangement of the red, green, and blue pixels Pr, Pg, and Pb in the second display area DA2. In an embodiment, FIGS. 8 and 9 show that the arrangement of pixels in the first display area DA1 is different from the arrangement of pixels in the second display area DA2, and a detailed structure thereof is as described above with reference to FIGS. 6A, 6B, 7A, and 7B. In other examples, the red, green, and blue pixels Pr, Pg, and Pb arranged in each of the pixel groups PG of the second display area DA2 may have a diamond PENTILE™ structure as described with reference to FIG. 7A.

A borderline BL1 between the first display area DA1 and the second display area DA2 may have a polygonal shape in a plan view, as shown in FIG. 8. In an embodiment, FIG. 8 shows that the borderline BL1 includes a polygon having 12 sides (e.g., approximately a cross shape), and corner portions of the above-described polygon may have a step configuration. In other examples, the number of sides included in the borderline BL1 may be less than or equal to 12. For example, the borderline BL1 between the first display area DA1 and the second display area DA2 may have four sides such as a quadrilateral, or the borderline BL1 may be shaped as a polygon having more than 12 sides.

Referring to FIG. 9, the pixels in the first display area DA1 and the pixels in the second display area DA2 are spaced apart by a distance from each other, and the distance may be greater than a distance between pixels adjacent to each other in the first display area DA1, and may be greater than a distance between pixels adjacent to each other in a pixel group PG. A cross-sectional structure of the pixels arranged in the first and second display areas DA1 and DA2 is described below with reference to FIG. 10.

Multiple transmission areas TA may be located in the second display area DA2. The transmission areas TA may be arranged to be apart from each other. A shape of the transmission area TA may be defined by a pixel-defining layer 123a, which is a light-shielding insulating layer, or an opening BML-OP of the blocking metal layer BML. In FIG. 9, the transmission area TA is a polygon having 12 sides (e.g., approximately a cross shape), and corner portions of the polygon described above may have a step configuration. In other examples, the transmission area TA may have various shapes such as a circular shape, an oval shape, and a polygonal shape.

As described above with reference to FIG. 4, the transmission area TA may include an area which may transmit light and/or sound. As indicated by dashed lines forming a circle in FIG. 8, a component CM may be disposed to overlap the transmission area TA.

As shown in FIG. 9, with respect to the transmission areas TA arranged in an outermost portion of the second display area DA2, the second display area DA2 may include a second outer display area DA21 located outside of the transmission area TA, and a second inner display area DA22 located inside of the transmission area TA. Some areas between the pixel groups PG adjacent to each other among the second outer display area DA21 may overlap the pixel-defining layer 123a, which is a light-shielding insulating layer. The second borderline BL2 is disposed between the second outer display area DA21 and the second inner display area DA22.

The transmission areas TA may be disposed in the second inner display area DA22. Referring to FIG. 9, the transmission area TA may be arranged between pixels (red pixels Pr) of a first pixel group PG1 and pixels (red pixels Pr) of a second pixel group PG2, the pixels being disposed in an ob direction that may head towards the center of the second display area DA2. Because a light-emitting diode is located in a pixel, it may be seen that the transmission area TA is located between a light-emitting diode of a display element group and a light-emitting diode of another display element group. The ob direction in FIG. 9 may be a direction intersecting the x direction and the y direction.

In the embodiment, an upper insulating layer 123b may be arranged on the pixel-defining layer 123a. The pixel-defining layer 123a may include a first opening 123OP1 and a second opening 123OP2 that define an emission area of light-emitting diodes, and the upper insulating layer 123b arranged above the pixel-defining layer 123a may include openings that respectively overlap the first opening 123OP1 and the second opening 123OP2 of the pixel-defining layer 123a.

In a plan view, an edge 123e of the upper insulating layer 123b may be arranged adjacent to the borderline BL1 of the first display area DA1 and the second display area DA2, and the upper insulating layer 123b may include a protrusion portion 123P protruding in a direction to the second display area DA2 from the edge 123e of the upper insulating layer 123b.

For example, the edge 123e of the upper insulating layer 123b may be arranged at a boundary portion of the first display area DA1 and the second display area DA2. The boundary portion may include an area between first light-emitting diodes arranged in the first display area DA1 and second light-emitting diodes arranged in the second display area DA2.

In a plan view, the protrusion portion 123P may be arranged to extend between a first pixel group PG1 and a third pixel group PG3 that are arranged at an outermost portion of the second display area DA2. The protrusion portion 123P may not overlap the blocking metal layer BML, and may be arranged to be spaced apart from the blocking metal layer BML in a plan view. An end of the protrusion portion 123P may be arranged in the second outer display area DA21.

The protrusion portion 123P of the upper insulating layer 123b may increase reflow performance of an organic layer included in an organic encapsulation layer 320 (refer to FIG. 4) of the thin-film encapsulation layer 300 (refer to FIG. 4), thereby minimizing or preventing a phenomenon in which the organic encapsulation layer 320 (refer to FIG. 4) does not fill in the second display area DA2.

The organic layer included in the organic encapsulation layer 320 may be provided by an inkjet process, and may be filled in a display panel by a spreading performance of the organic layer discharged by inkjet. The spreading performance of the organic layer may increase when an uneven structure is provided in an area where a step is provided.

In the embodiment, a protrusion portion may be provided at an edge of the upper insulating layer 123b to constitute an uneven structure, and thus, the spreading performance of the organic layer constituting the organic encapsulation layer 320 may be improved, and thus, a phenomenon in which the organic encapsulation layer 320 does not fill in the second display area DA2 may be minimized.

Figure 10:
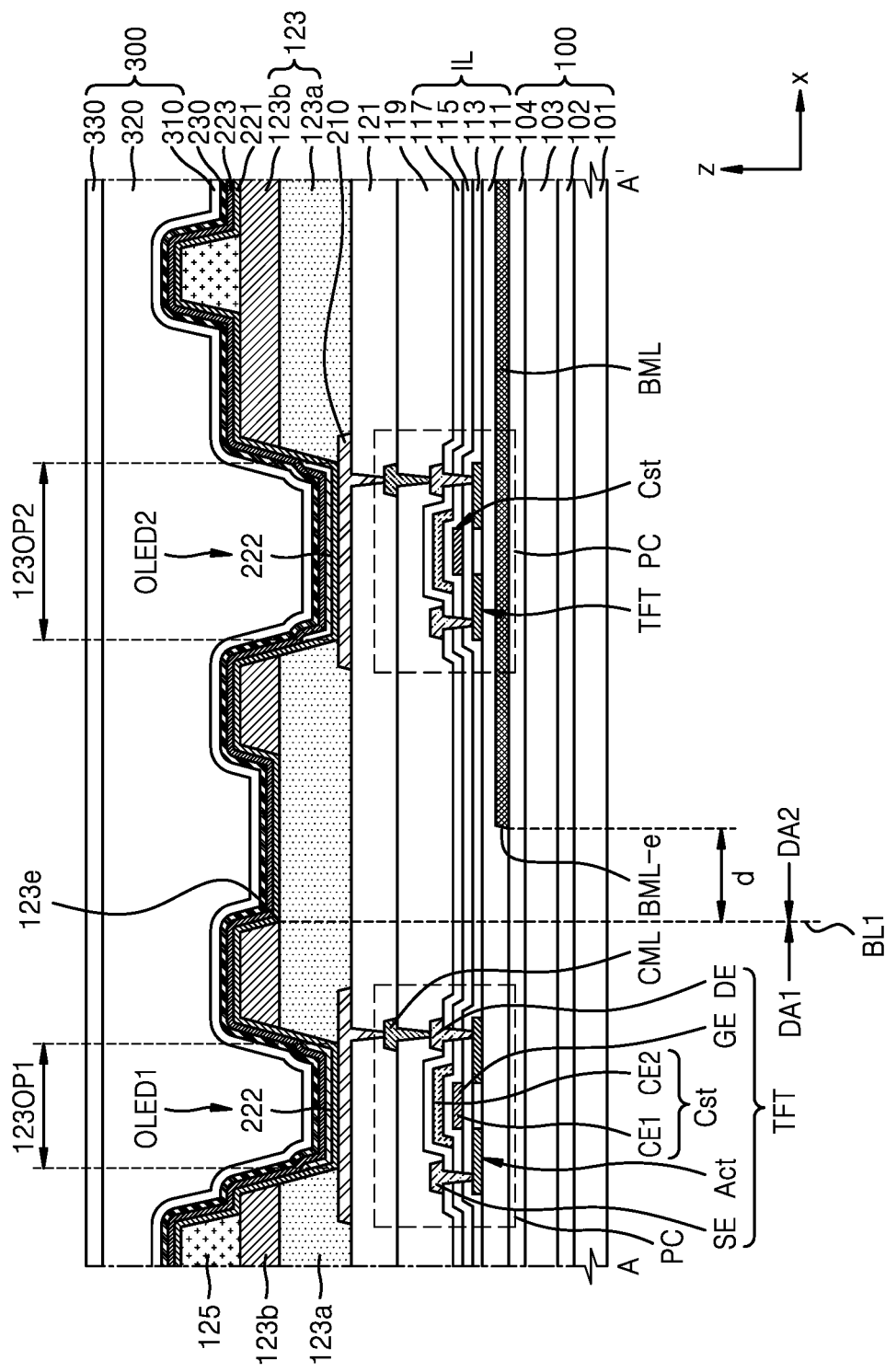
FIG. 10 is a schematic cross-sectional view of the display panel in FIG. 9 taken along a line A-A' in FIG. 9.

FIG. 10 is a cross-sectional view of the display panel in FIG. 9 taken along a line A-A' in FIG. 9. FIG. 10 shows a case in which a light-emitting diode of the display panel includes an organic light-emitting diode. An organic light-emitting diode as a light-emitting diode may be arranged in each of the first and second display areas DA1 and DA2, and for convenience of explanation, an organic light-emitting diode arranged in the first display area DA1 is referred to as a first organic light-emitting diode OLED1, and an organic light-emitting diode arranged in the second display area DA2 is referred to as a second organic light-emitting diode OLED2.

The substrate 100 may include a first base layer 101, a first barrier layer 102, a second base layer 103, and a second barrier layer 104. The first base layer 101 and the second base layer 103 may each include a polymer resin, and the first base layer 101 and the second base layer 103 may each include an inorganic insulating material. The polymer resin may include polyethersulfone, polyacrylate, polyetherimide, polyethylene naphthalate, PET, polyphenylene sulfide, polyarylate, PI, polycarbonate, and/or cellulose acetate propionate.

The buffer layer 111 may be arranged on the substrate 100. The buffer layer 111 may reduce or block penetration of foreign materials, moisture, or ambient air from a lower portion of the substrate 100. The buffer layer 111 may include an inorganic insulating material such as silicon oxide, silicon oxynitride, or silicon nitride, and may have a single-layer or multi-layer structure including the above-described material.

The blocking metal layer BML may be between the substrate 100 and the buffer layer 111, and may be located in the second display area DA2. The blocking metal layer BML may prevent light progressing to the component CM (see FIG. 8) arranged in the second display area DA2 or light emitted from the component CM (see FIG. 8) from affecting an electronic element, such as the thin-film transistor TFT of the pixel circuit PC. An end BML-e of the blocking metal layer BML may be arranged in the second outer display area DA21. The end BML-e of the blocking metal layer BML may overlap a body of the pixel-defining layer 123a that is a light-shielding insulating layer. The end BML-e of the blocking metal layer BML may be spaced apart by a distance d from the borderline BL1 of the first display area DA1 and the second display area DA2.

The blocking metal layer BML may include a metal having conductivity, such as aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu).

The first organic light-emitting diode OLED1 and the second organic light-emitting diode OLED2 may be electrically connected to the pixel circuit PC. The first organic light-emitting diode OLED1 may be electrically connected to the pixel circuit PC between the substrate 100 and the first organic light-emitting diode OLED1, and the second organic light-emitting diode OLED2 may be electrically connected to the pixel circuit PC between the substrate 100 and the second organic light-emitting diode OLED2.

The pixel circuits PC may include the thin-film transistor TFT and the storage capacitor Cst. The thin-film transistor TFT may include a semiconductor layer Act, a gate electrode GE overlapping a channel area of the semiconductor layer Act, and a source electrode SE and a drain electrode DE respectively electrically connected to a source area and a drain area of the semiconductor layer Act. A gate insulating layer 113 may be between the semiconductor layer Act and the gate electrode GE, and a first interlayer insulating layer 115 and a second interlayer insulating layer 117 may be arranged between the gate electrode GE and the source electrode SE or between the gate electrode GE and the drain electrode DE.

The storage capacitor Cst may overlap the thin-film transistor TFT. The storage capacitor Cst may include a lower electrode CE1 and an upper electrode CE2 overlapping each other. In an embodiment, the gate electrode GE of the thin-film transistor TFT may include the lower electrode CE1 of the storage capacitor Cst. The first interlayer insulating layer 115 may be arranged between the lower electrode CE1 and the upper electrode CE2.

The semiconductor layer Act may include polysilicon. In some embodiments, the semiconductor layer Act may include amorphous silicon. In some embodiments, the semiconductor layer Act may include an oxide semiconductor of at least one material selected from the group consisting of indium (In), gallium (Ga), tin (Sn), zirconium (Zr), vanadium (V), hafnium (Hf), cadmium (Cd), germanium (Ge), Cr, Ti, and zinc (Zn). The semiconductor layer Act may include a channel area, a source area, and a drain area, the source area and the drain area being doped with impurities.

The gate insulating layer 113 may include an inorganic insulating material such as silicon oxide, silicon oxynitride, or silicon nitride, and may have a single-layer or multi-layer structure including the above-described material.

The gate electrode GE or the lower electrode CE1 may each include a low resistance conductive material such as Mo, Al, Cu, and/or Ti, and may have a single-layer or multi-layer structure having the above-described material.

The first interlayer insulating layer 115 may include an inorganic insulating material such as silicon oxide, silicon oxynitride, or silicon nitride, and may have a single-layer or multi-layer structure including the above-described material.

The upper electrode CE2 may include Al, Pt, Pd, Ag, Mg, Au, Ni, Nd, Ir, Cr, Ni, Ca, Mo, Ti, W, and/or Cu, and may have a single-layer or multi-layer structure including the above-described material.

The second interlayer insulating layer 117 may include an inorganic insulating material such as silicon oxide, silicon oxynitride, or silicon nitride, and may have a single-layer or multi-layer structure including the above-described material.

The source electrode SE and/or the drain electrode DE may include Al, Pt, Pd, Ag, Mg, Au, Ni, Nd, Ir, Cr, Ni, Ca, Mo, Ti, W, and/or Cu, and may have a single-layer or multi-layer structure including the above-described material. For example, the source electrode SE and/or the drain electrode DE may have a three-layer structure including a Ti layer, an Al layer, and another Ti layer.

A first organic insulating layer 119 may be disposed on the thin-film transistor TFT, and the thin-film transistor TFT may be electrically connected to a first electrode 210 of a corresponding organic light-emitting diode through a connection electrode layer CML arranged on the first organic insulating layer 119. The connection electrode layer CML may be electrically connected to the thin-film transistor TFT through a contact hole of the first organic insulating layer 119, and the first electrode 210 may be electrically connected to the connection electrode layer CML through a contact hole of a second organic insulating layer 121.

The first organic insulating layer 119 and/or the second organic insulating layer 121 may include an organic insulating material such as acryl, benzocyclobutene (BCB), PI, or hexamethyldisiloxane (HMDSO). In some embodiments, the connection electrode layer CML and the second organic insulating layer 121 may be omitted, in which case the first electrode 210 may be directly connected to the thin-film transistor TFT through a contact hole of the first organic insulating layer 119.

Each of the first organic light-emitting diode OLED1 and the second organic light-emitting diode OLED2 may include an overlapping structure of the first organic light-emitting diode OLED1, an emission layer 222, and a second electrode 230. The above-described overlapping structure may include a first functional layer 221 between the first electrode 210 and the emission layer 222, and/or a second functional layer 223 between the emission layer 222 and the second electrode 230.

The first electrode 210 may be located on the second organic insulating layer 121. The first electrode 210 may include a reflective layer including Ag, Mg, Al, Pt, Pd, Au, Ni, Nd, Ir, Cr, or any compounds thereof. The first electrode 210 may include the reflective layer including the above-described material, and a transparent conductive layer arranged on and/or under the reflective layer. The transparent conductive layer may include indium tin oxide (ITO), indium zinc oxide (IZO), zinc oxide (ZnO), indium oxide ($In_2O_3$), indium gallium oxide (IGO), or aluminum zinc oxide (AZO). In an embodiment, the first electrode 210 may have a three-layer structure including an ITO layer, an Ag layer, and another ITO layer.

The pixel-defining layer 123a may include an opening covering an edge of the first electrode 210 and overlapping the first electrode 210. Regarding this, FIG. 10 shows an opening overlapping the first electrode 210 of the first organic light-emitting diode OLED1 (hereinafter, referred to as a first opening 123OP1), and an opening overlapping the first electrode 210 of the second organic light-emitting diode OLED2 (hereinafter, referred to as a second opening 123OP2). In some embodiments, the second opening 123OP2 may be larger than the first opening 123OP1.

The first opening 123OP1 and the second opening 123OP2 of the pixel-defining layer 123a may define emission areas of the first and second organic light-emitting diodes OLED1 and OLED2, respectively. For example, a width of the first opening 123OP1 of the pixel-defining layer 123a may correspond to a width of the emission area of the first organic light-emitting diode OLED1, and a width of the second opening 123OP2 of the pixel-defining layer 123a may correspond to a width of the emission area of the second organic light-emitting diode OLED2.

The pixel-defining layer 123a may include a light-shielding insulating layer. The pixel-defining layer 123a may include a colored insulating layer, and may have, for example, black color. For example, the pixel-defining layer 123a may include a PI-based binder, and red, green, and blue mixed pigments. In some embodiments, the pixel-defining layer 123a may include a cardo-based binder resin and a mixture of lactam-based black pigment and blue pigment. In some embodiments, the pixel-defining layer 123a may include carbon black. The pixel-defining layer 123a may prevent external light from being reflected and may improve contrast of the display panel.

The upper insulating layer 123b may be arranged on the pixel-defining layer 123a. The upper insulating layer 123b may improve the strength of the display panel. The upper insulating layer 123b may include an organic insulating layer such as PI, polyamide, an acrylic resin, BCB, HMDSO, and a phenol resin, and may be provided by a spin coating method or the like.

In an embodiment, the upper insulating layer 123b may include a material different from that of the pixel-defining layer 123a. For example, while the pixel-defining layer 123a may include a negative photosensitive material, the upper insulating layer 123b may include different materials such as a positive photosensitive material, and each may be provided through a separate mask process.

The pixel-defining layer 123a and the upper insulating layer 123b may constitute a step at a boundary of the first display area DA1 and the second display area DA2. In other words, the upper insulating layer 123b may expose an upper surface of the upper insulating layer 123b at the above-described boundary.

A spacer 125 may be arranged on the upper insulating layer 123b. The spacer 125 may protrude from the upper surface of the upper insulating layer 123b. The spacer 125 may include an element for preventing dents during a mask process for providing the emission layer 222 or the like.

The spacer 125 may include an organic insulating layer such as PI, polyamide, an acrylic resin, BCB, HMDSO, and a phenol resin, and may be provided by a spin coating method or the like. The spacer 125 and the upper insulating layer 123b may include a same material, and may be provided by a same process. The thicknesses of the spacer 125 and the upper insulating layer 123b may be different from each other by using a mask having a full tone and a half-tone.

The emission layer 222 may be located to correspond to each of the first opening 123OP1 and the second opening 123OP2 of a light-shielding insulating layer 123, and may overlap the first electrode 210. The emission layer 222 may include a polymer organic material or a low-molecular weight organic material that emits light of a color. The first functional layer 221 and the second functional layer 223 may be provided below and above the emission layer 222, respectively.

The first functional layer 221 may include a hole transport layer (HTL) and/or a hole injection layer (HIL). The second functional layer 223 may include an electron transport layer (ETL) and/or an electron injection layer (EIL). Unlike the emission layer 222, the first functional layer 221 and/or the second functional layer 223 may be provided entirely over the substrate 100. In other words, the first functional layer 221 and/or the second functional layer 223 may cover the first display area DA1 and the second display area DA2.

The thin-film encapsulation layer 300 may cover the first and second organic light-emitting diodes OLED1 and OLED2. In an embodiment, the thin-film encapsulation layer 300 may include a first inorganic encapsulation layer 310, a second inorganic encapsulation layer 330, and the organic encapsulation layer 320 therebetween.

Each of the first and second inorganic encapsulation layers 310 and 330 may include one or more inorganic insulating materials. The inorganic insulating materials may include aluminum oxide, titanium oxide, tantalum oxide, hafnium oxide, zinc oxide, silicon oxide, silicon nitride, and/or silicon oxynitride.

The organic encapsulation layer 320 may include a polymer-based material. The polymer-based material may include an acryl-based resin, an epoxy-based resin, PI, and polyethylene. For example, the organic encapsulation layer 320 may include an acryl-based resin, for example, poly (methyl methacrylate) or polyacrylic acid. The organic encapsulation layer 320 may be provided by curing a monomer or coating a polymer.

Figure 11:
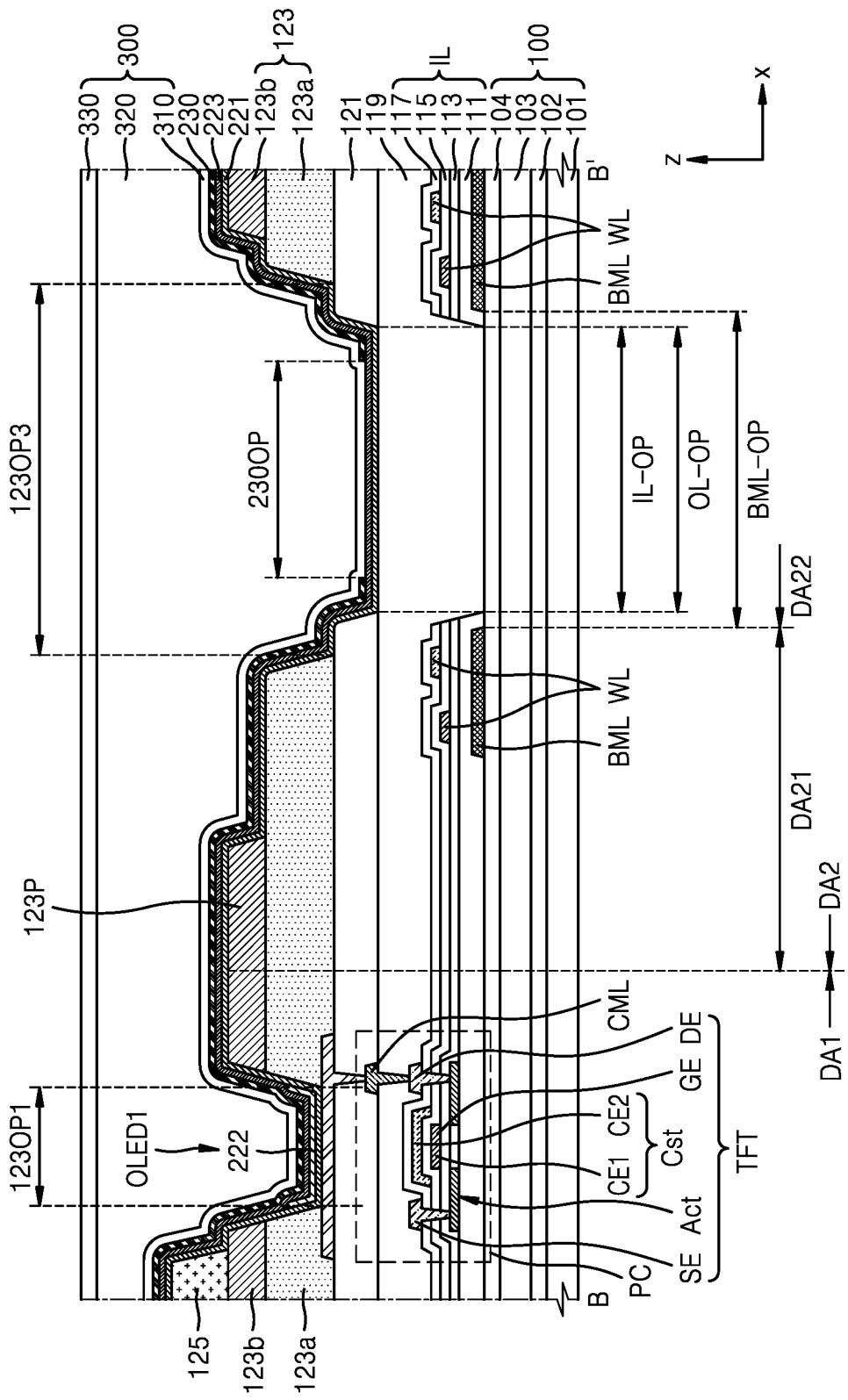
FIG. 11 is a schematic cross-sectional view of the display panel in FIG. 9 taken along a line B-B' in FIG. 9.

FIG. 11 is a cross-sectional view of the display panel in FIG. 9 taken along a line B-B', and shows a transmission area TA disposed at the outer periphery of the second inner display area DA22 shown in FIG. 9, and its cross-sectional structure.

Referring to FIG. 11, the first organic light-emitting diode OLED1 and the electrically connected pixel circuit PC may be arranged in the first display area DA1, and the transmission area TA may be provided in the second display area DA2. The transmission area TA may be defined by the smaller opening among opening 123OP3 of the pixel-defining layer 123a formed of a light-shielding insulating material and the opening BML-OP of the blocking metal layer BML.

The pixel-defining layer 123a may include an opening (hereinafter, a third opening 123OP3) corresponding to the transmission area TA. The pixel-defining layer 123a may include the third opening 123OP3.

The first and second functional layers 221 and 223 may also be in a portion corresponding to the transmission area TA. The second electrode 230 including a metal element may include an opening (hereinafter, referred to as a fourth opening 230OP) corresponding to the transmission area TA. Transmittance of the transmission area TA may be improved by the fourth opening 230OP thereof. A size (or width) of the fourth opening 230OP of the second electrode 230 may be less than a size (or width) of the third opening 123OP3.

Some insulating layers (for example, inorganic insulating layers) from among insulating layers arranged below the first electrode 210 may also include an opening corresponding to the transmission area TA. For example, a stack of the second barrier layer 104, the buffer layer 111, the gate insulating layer 113, the first interlayer insulating layer 115, and the second interlayer insulating layer 117 may include an inorganic insulating material, and may include an opening (hereinafter, referred to as a fifth opening IL-OP) corresponding to the transmission area TA. A portion of the first organic insulating layer 119 arranged on the above-described stack may be present in the fifth opening IL-OP. FIG. 11 shows that the fifth opening IL-OP includes an overlapping structure of openings of the buffer layer 111, the gate insulating layer 113, the first interlayer insulating layer 115, and the second interlayer insulating layer 117. In other examples, the fifth opening IL-OP may include a groove provided by removing a portion of the second barrier layer 104.

The second organic insulating layer 121 arranged above the first organic insulating layer 119 may include an opening (hereinafter, referred to as a sixth opening OL-OP) corresponding to the transmission area TA.

The blocking metal layer BML arranged between the substrate 100 and the pixel circuit PC may include an opening (hereinafter, referred to as a seventh opening BML-OP) overlapping the transmission area TA, wherein a size (or width) of the seventh opening BML-OP may be greater than a size (or width) of the fifth opening IL-OP of the stack of the insulating layers.

An inorganic insulating layer IL, the first organic insulating layer 119, the second organic insulating layer 121, and the like may include a light transparent material, and the transmission area TA may be defined by the opening having the smaller area among the third opening 123OP3 of the pixel-defining layer 123a and the seventh opening BML-OP of the blocking metal layer BML.

In the second display area DA2, a bridge area in which lines WL are arranged may be arranged at opposite sides of the transmission area TA. The lines WL, at least one of the gate electrode GE, the source electrode SE, the drain electrode DE of the thin-film transistor TFT, and the upper electrode CE2 of the storage capacitor Cst may be arranged on the same layer. The lines WL may include lines arranged on different layers from each other. Because the lines WL may overlap the body of the blocking metal layer BML, a light diffraction phenomenon due to the lines WL may not occur.

In the second outer display area DA21, the upper insulating layer 123b may be arranged on the pixel-defining layer 123a to constitute a step with the pixel-defining layer 123a. The upper insulating layer 123b may include the protrusion portion 123P that protrudes from an edge of the upper insulating layer 123b to the second display area DA2 in a plan view. In other words, the protrusion portion 123P, which is a portion of the upper insulating layer 123b, may be provided to protrude toward the second display area DA2 at a boundary of the first display area DA1 and the second display area DA2. The end of the protrusion portion 123P may be arranged in the second outer display area DA21. The upper insulating layer 123b may be arranged above the pixel-defining layer 123a in the first display area DA1 and the second inner display area DA22 so as to improve the strength of the display panel.

The first inorganic encapsulation layer 310 and the organic encapsulation layer 320 of the thin-film encapsulation layer 300 may be arranged in the sixth opening OL-OP of the second organic insulating layer 121, the fourth opening 230OP of the second electrode 230, and the third opening 123OP3 of the pixel-defining layer 123a.

Figure 12A:
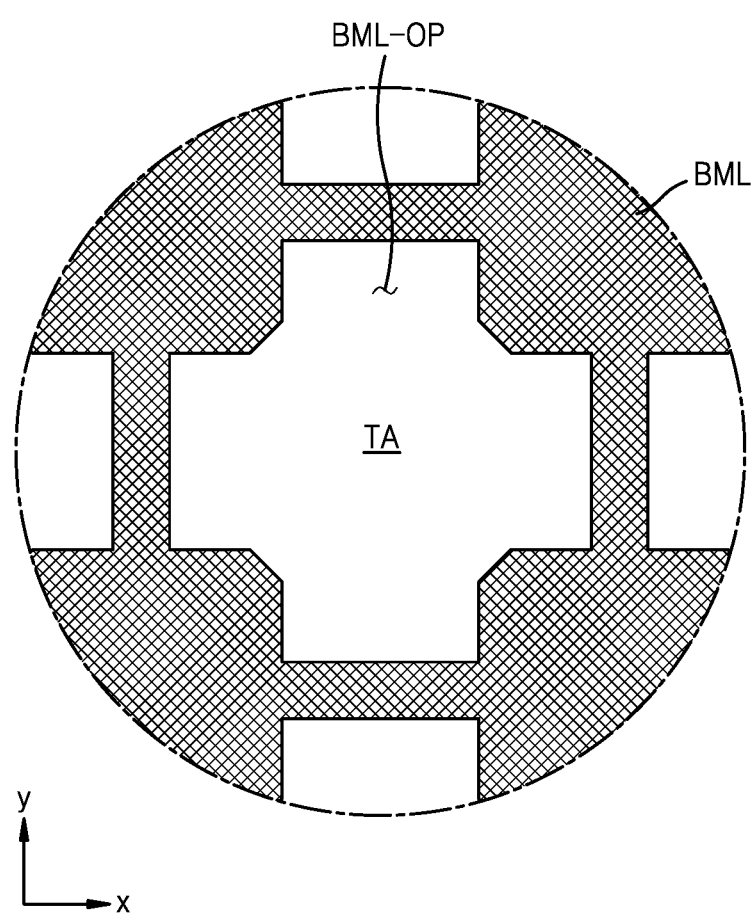
FIGS. 12A and 12B are schematic plan views illustrating a transmission area according to embodiments.
Figure 12B:
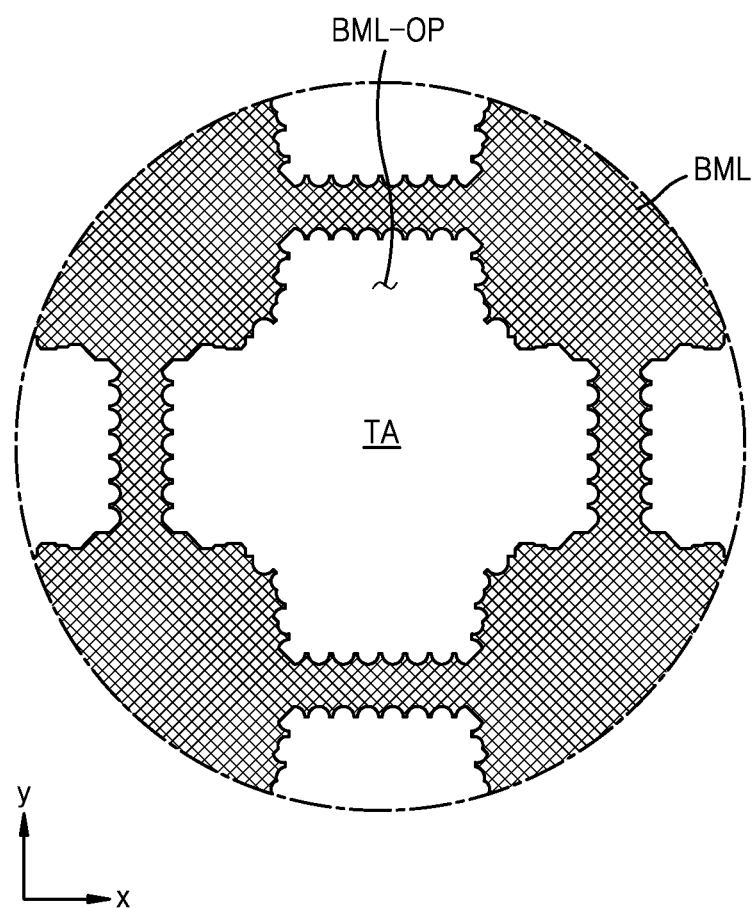

FIGS. 12A and 12B are schematic plan views illustrating a transmission area TA according to an embodiment.

Referring to FIGS. 12A and 12B, the transmission area TA may have approximately a cross shape in a plan view. As described above with reference to FIGS. 12A and 12B, the pixel-defining layer 123a and the blocking metal layer BML may respectively include the third opening 123OP3 and the seventh opening BML-OP that correspond to the transmission area TA, and at least one of the third opening 123OP3 and the seventh opening BML-OP may include straight edges or edges having fine protrusions.

In an embodiment, FIGS. 12A and 12B show that an edge of the seventh opening BML-OP includes straight edges or edges having fine protrusions. Edges of the blocking metal layer BML that define the seventh opening BML-OP may include straight edges as shown in FIG. 12A or may include a repetitive uneven structure as shown in FIG. 12B, and the transmission area TA may include a straight edge or an edge of a repetitive uneven structure in a plan view. When the transmission area TA includes an edge of a repetitive uneven structure, diffraction of light passing through the transmission area TA may be prevented or minimized.

In FIGS. 12A and 12B, an edge of the blocking metal layer BML is straight or has fine protrusions, but is not limited thereto. In other examples, the edges of the pixel-defining layer 123a that define the third opening 123OP3 may include both straight edges and edges having fine protrusions.

Figure 13:
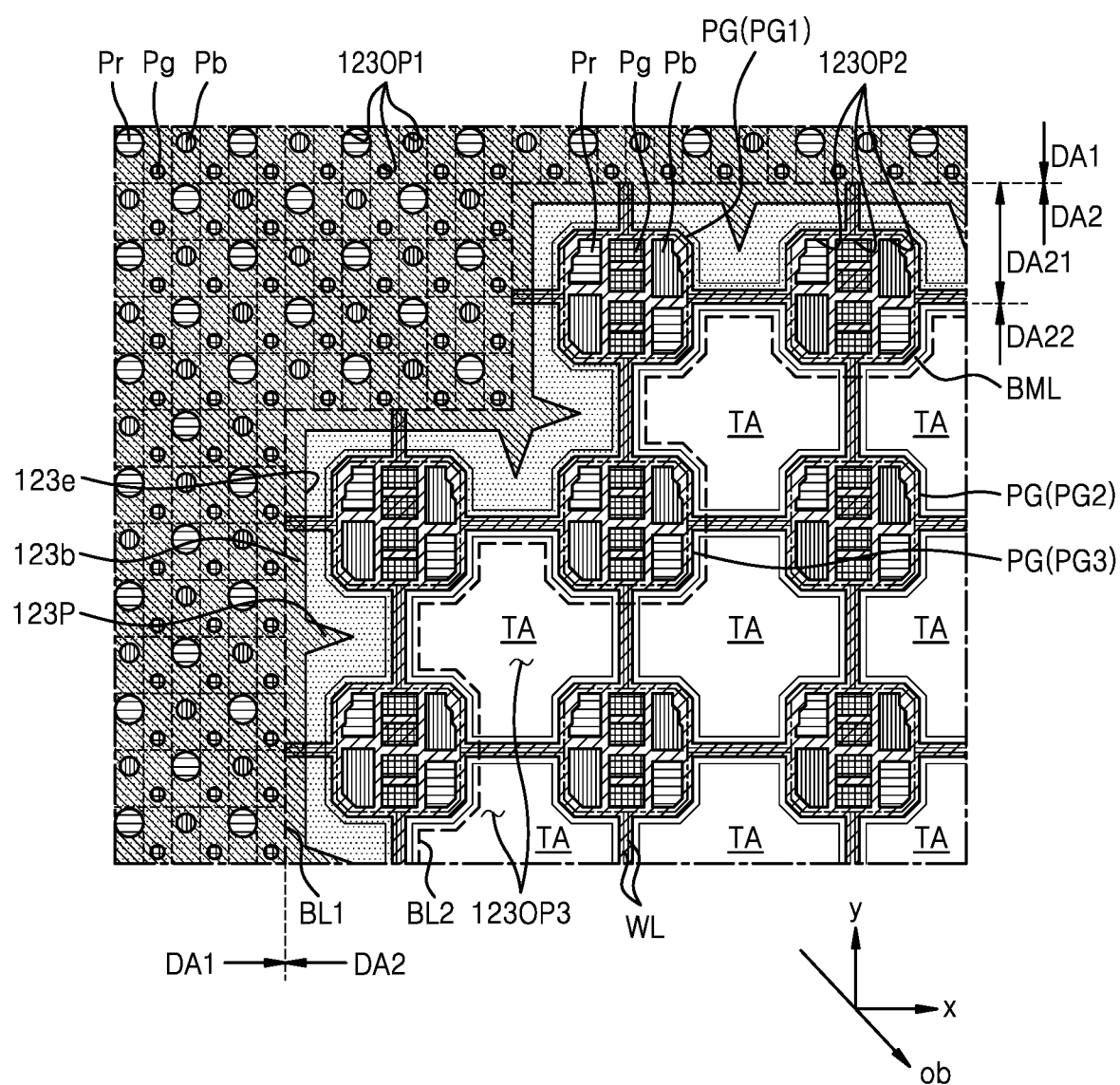
FIG. 13 is a schematic plan view illustrating a second display area of a display panel and a first display area therearound, according to an embodiment.
Figure 14:
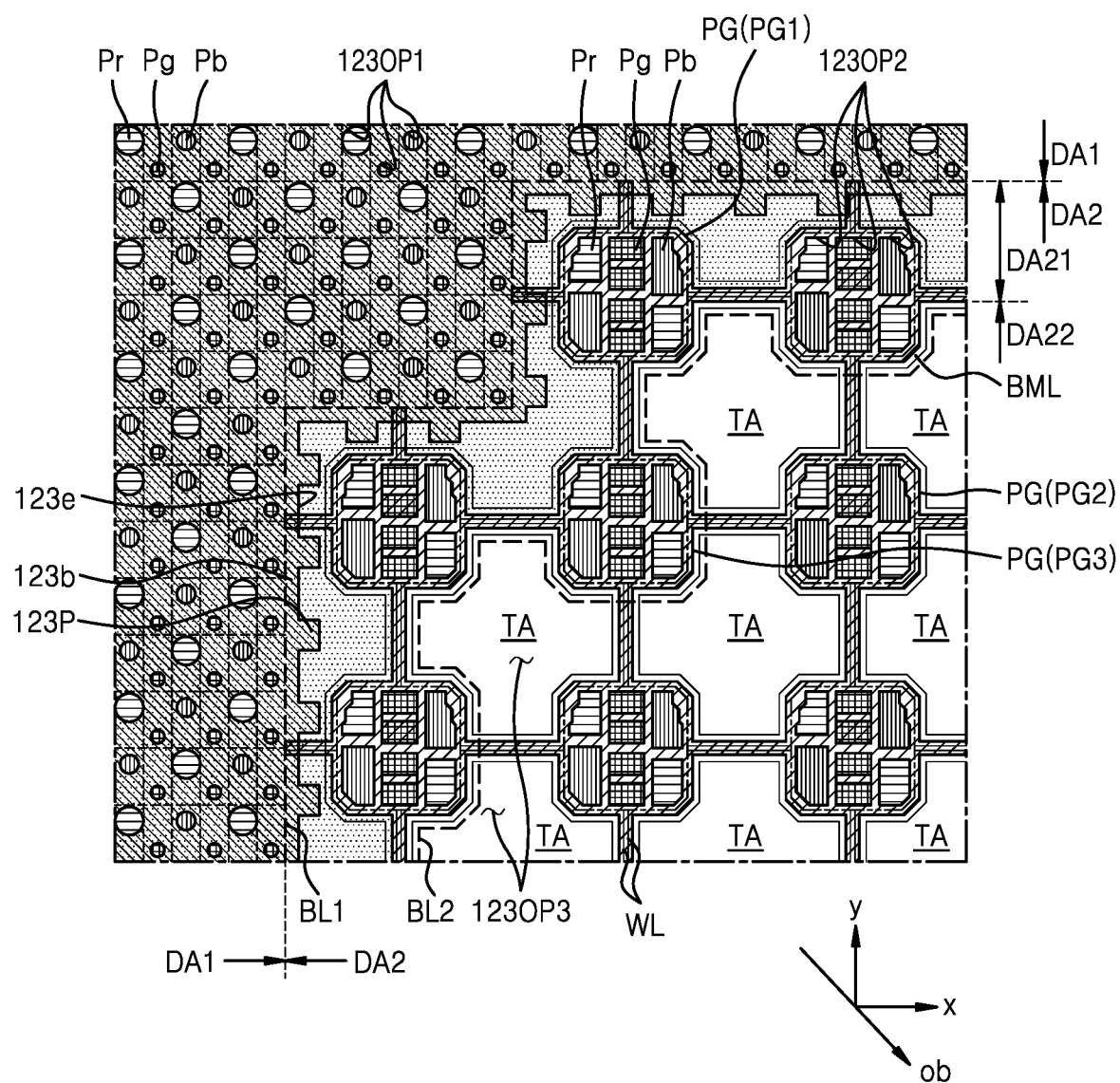
FIG. 14 is a schematic plan view illustrating a second display area of a display panel and a first display area therearound, according to an embodiment.

FIGS. 13 and 14 are schematic plan views illustrating a second display area DA2 of a display panel and a first display area DA1 therearound, according to embodiments.

Referring to FIGS. 13 and 14, the display panel according to embodiments may include the pixel-defining layer 123a and the upper insulating layer 123b arranged above the pixel-defining layer 123a, and an edge of the upper insulating layer 123b may be adjacent to the borderline BL1 of the first display area DA1 and the second display area DA2.

For example, the edge of the upper insulating layer 123b may be arranged at the boundary portion of the first display area DA1 and the second display area DA2. The boundary portion may include an area between first light-emitting diodes arranged in the first display area DA1 and second light-emitting diodes arranged in the second display area DA2.

In the boundary portion, the upper insulating layer 123b may include the protrusion portion 123P that protrudes in a direction towards the second display area DA2 from an edge of the upper insulating layer 123b in a plan view.

As shown in FIG. 13, the protrusion portion 123P may be arranged between the first pixel group PG1 and the third pixel group PG3 that are arranged in an outermost portion of the second display area DA2.

As shown in FIG. 14, the protrusion portion 123P may not be arranged between the first pixel group PG1 and the third pixel group PG3 that are arranged in an outermost portion of the second display area DA2. A length from an edge of the upper insulating layer 123b to an end of the protrusion portion 123P may be less than a minimum distance from the borderline BL1 to the first pixel group PG1.

The protrusion portion 123P may have various shapes in a plan view. The protrusion portion 123P may have a shape in which a width thereof decreases as a distance from an edge of the upper insulating layer 123b increases. For example, the protrusion portion 123P may have a triangular shape. A shape of the protrusion portion 123P is not limited thereto. The protrusion portion 123P may have various shapes such as a circular shape, an oval shape, and a polygonal shape.

Multiple protrusion portions 123P may be provided along the edge of the upper insulating layer 123b. The protrusions 123P may be spaced apart from each other by a distance.

Figure 15:
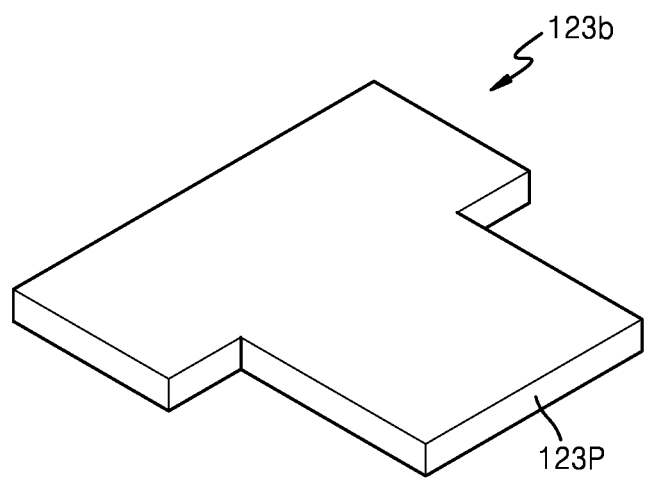
FIG. 15 is a schematic perspective view illustrating a shape of an upper insulating layer according to an embodiment.
Figure 16:
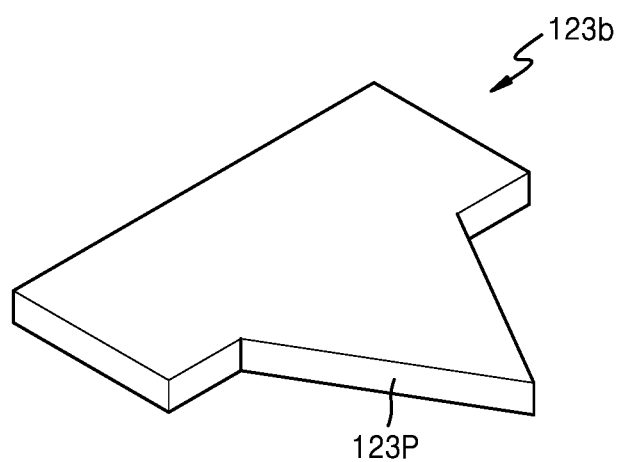
FIG. 16 is a schematic perspective view illustrating a shape of an upper insulating layer according to an embodiment.
Figure 17:
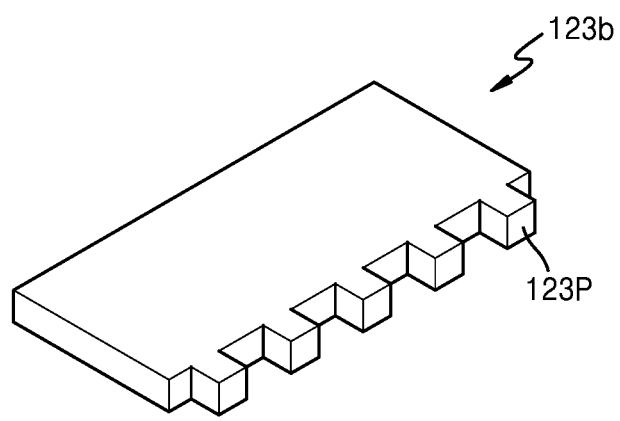
FIG. 17 is a schematic perspective view illustrating a shape of an upper insulating layer according to an embodiment.

FIGS. 15 to 17 are perspective views schematically illustrating a shape of an upper insulating layer 123b according to one or more embodiments.

Referring to FIGS. 15 to 17, the upper insulating layer 123b may include the protrusion portion 123P that protrudes in a horizontal direction from an edge of the upper insulating layer 123b. As shown in FIGS. 15 and 16, the protrusion portion 123P may have a polygonal shape such as a quadrilateral shape and a triangular shape. When multiple protrusion portions 123P are provided and the protrusions 123P are spaced apart from each other by a distance as shown in FIG. 17, an edge of the upper insulating layer 123b may have an uneven shape as a whole.

As described above, in a display panel and an electronic apparatus according to the embodiments of the disclosure, a protrusion provided at an edge of an upper insulating layer of a pixel-defining layer may be provided in a boundary portion of a first display area and a second display area, thus minimizing a phenomenon of the organic encapsulation layer failing to fill in portions.

It should be understood that embodiments described herein should be considered in a descriptive sense only and not for purposes of limitation. Descriptions of features or aspects within each of the embodiments should typically be considered as available for other similar features or aspects in other embodiments. While one or more embodiments have been described with reference to the figures, it will be understood by those of ordinary skill in the art that various changes in form and details may be made therein without departing from the spirit and scope included in the following claims.

What is claimed is:

1. An electronic apparatus comprising:
   a display panel comprising:
      a first display area;
      first light-emitting diodes disposed in the first display area;
      a second display area;
      display element groups comprising second light-emitting diodes, the display element groups disposed in the second display area;
      transmission areas disposed in the second display area,
      a pixel-defining layer disposed on a substrate and surrounding an emission area of each of the first light-emitting diodes and each of the second light-emitting diodes;
      an upper insulating layer disposed above the pixel-defining layer; and
      a thin-film encapsulation layer overlapping the first light-emitting diodes and the second light-emitting diodes in a plan view, the thin-film encapsulation layer comprising an inorganic encapsulation layer and an organic encapsulation layer; and a component disposed on a lower surface of the display panel and overlapping the second display area in a plan view, wherein the pixel-defining layer and the upper insulating layer form a staircase-shaped step in a boundary portion of the first display area and the second display area, and, the upper insulating layer comprises at least one protrusion portion disposed in the boundary portion of the first display area and the second display area, the at least one protrusion portion protruding in a direction towards the second display area from an edge of the upper insulating layer.

2. The electronic apparatus of claim 1, wherein the pixel-defining layer comprises:
first openings corresponding to the first light-emitting diodes;
second openings corresponding to the second light-emitting diodes; and
third openings corresponding to the transmission areas.

3. The electronic apparatus of claim 1, wherein the at least one protrusion includes a plurality of protrusion portions disposed between display element groups that are disposed at an outermost portion of the second display area in a plan view.

4. The electronic apparatus of claim 1, wherein
the at least one protrusion portion includes a plurality of protrusion portions, and
the plurality of protrusion portions are spaced apart by a distance from each other along the boundary portion of the first display area and the second display area in a plan view.

5. The electronic apparatus of claim 1, wherein the at least one protrusion portion has a polygonal shape in a plan view.

6. The electronic apparatus of claim 1, further comprising:
an inorganic insulating layer disposed between the substrate and the second light-emitting diodes;
a first organic insulating layer disposed between the inorganic insulating layer and the second light-emitting diodes; and
a second organic insulating layer disposed between the first organic insulating layer and the second light-emitting diodes, wherein
the inorganic insulating layer comprises openings corresponding to the transmission areas, and
the first organic insulating layer fills in the openings of the inorganic insulating layer.

7. The electronic apparatus of claim 1, wherein the pixel-defining layer comprises a light-shielding material.

8. The electronic apparatus of claim 1, further comprising:
a blocking metal layer disposed between the substrate and the second light-emitting diodes in the second display area, wherein the blocking metal layer comprises openings corresponding to the transmission areas.

9. The electronic apparatus of claim 8, wherein edges of the openings of the blocking metal layer include fine protrusions.

10. The electronic apparatus of claim 1, further comprising:
a spacer protruding in a vertical direction from an upper surface of the upper insulating layer,
wherein the spacer and the upper insulating layer comprise a same material.

11. A display panel comprising:
a first display area;
first light-emitting diodes disposed in the first display area;
a second display area;
display element groups comprising second light-emitting diodes, the display element groups disposed in the second display area;
transmission areas disposed in the second display area;
a pixel-defining layer arranged on a substrate and surrounding an emission area of each of the first light-emitting diodes and each of the second light-emitting diodes;
an upper insulating layer disposed above the pixel-defining layer; and
a thin-film encapsulation layer overlapping the first light-emitting diodes and the second light-emitting diodes in a plan view, the thin-film encapsulation layer comprising an inorganic encapsulation layer and an organic encapsulation layer, wherein
the pixel-defining layer and the upper insulating layer form a staircase-shaped step in a boundary portion of the first display area and the second display area, and,
the upper insulating layer comprises at least one protrusion portion disposed in the boundary portion of the first display area and the second display area, the at least one protrusion portion protruding in a direction towards the second display area from an edge of the upper insulating layer.

12. The display panel of claim 11, wherein the pixel-defining layer comprises:
first openings corresponding to the first light-emitting diodes;
second openings corresponding to the second light-emitting diodes; and
third openings corresponding to the transmission areas.

13. The display panel of claim 11, wherein the at least one protrusion portion includes a plurality of protrusion portions disposed between display element groups that are disposed at an outermost portion of the second display area in a plan view.

14. The display panel of claim 11, wherein
the at least one protrusion portion includes a plurality of protrusion portions, and
the plurality of protrusion portions are spaced apart by a distance from each other along the boundary portion of the first display area and the second display area in a plan view.

15. The display panel of claim 11, wherein the at least one protrusion portion has a polygonal shape in a plan view.

16. The display panel of claim 11, further comprising:
an inorganic insulating layer disposed between the substrate and the second light-emitting diodes;
a first organic insulating layer disposed between the inorganic insulating layer and the second light-emitting diodes; and
a second organic insulating layer disposed between the first organic insulating layer and the second light-emitting diodes, wherein
the inorganic insulating layer comprises openings corresponding to the transmission areas, and
the first organic insulating layer fills in the openings of the inorganic insulating layer.

17. The display panel of claim 11, wherein the pixel-defining layer comprises a light-shielding material.

18. The display panel of claim 11, further comprising:
a blocking metal layer disposed between the substrate and the second light-emitting diodes in the second display area,
wherein the blocking metal layer comprises openings corresponding to the transmission areas.

19. The display panel of claim 18, wherein edges of the openings of the blocking metal layer include fine protrusions.

20. The display panel of claim 11, further comprising:
a spacer protruding in a vertical direction from an upper surface of the upper insulating layer,
wherein the spacer and the upper insulating layer comprise a same material.

* * * * *